(12) United States Patent
Yamamoto et al.

(10) Patent No.: US 10,709,037 B2
(45) Date of Patent: Jul. 7, 2020

(54) MOTOR DRIVE DEVICE INCLUDING FAN UNIT

(71) Applicant: FANUC CORPORATION, Yamanashi (JP)

(72) Inventors: Kazuhiro Yamamoto, Yamanashi (JP); Makoto Takeshita, Yamanashi (JP); Shinichi Horikoshi, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/180,362

(22) Filed: Nov. 5, 2018

(65) Prior Publication Data
US 2019/0141857 A1 May 9, 2019

(30) Foreign Application Priority Data
Nov. 7, 2017 (JP) .................. 2017-214946

(51) Int. Cl.
| H05K 7/20 | (2006.01) |
| F16B 2/18 | (2006.01) |
| F16B 2/04 | (2006.01) |
| F16M 13/02 | (2006.01) |
| F16B 9/00 | (2006.01) |

(52) U.S. Cl.
CPC .......... *H05K 7/20581* (2013.01); *F16B 2/04* (2013.01); *F16B 2/185* (2013.01); *F16B 9/07* (2018.08); *F16M 13/02* (2013.01); *H05K 7/20172* (2013.01); *H05K 7/20909* (2013.01)

(58) Field of Classification Search
CPC ........... H05K 7/20581; H05K 7/20172; H05K 7/20909; H05K 5/0221; H05K 5/0239
See application file for complete search history.

(56) References Cited

U.S. PATENT DOCUMENTS 6,373,713 B1 * 4/2002 Jensen ................. H05K 7/1409 211/41.17
7,301,778 B1 * 11/2007 Fang .................... H05K 7/1409 312/223.2
(Continued)

FOREIGN PATENT DOCUMENTS

| CN | 101395393 A | 3/2009 |
| CN | 103155729 A | 6/2013 |
(Continued)

OTHER PUBLICATIONS

English Abstract and Machine Translation for Japanese Publication No. 2009-027776 A, published Feb. 5, 2009, 10 pgs.
(Continued)

*Primary Examiner* — Eret C McNichols
(74) *Attorney, Agent, or Firm* — Fredrikson & Byron P.A.

(57) ABSTRACT

A motor drive device capable of attaching a fan unit to a mounting member more easily. The motor drive device includes the mounting member formed with a mounting hole, the fan unit including a lid positioned facing the mounting member to cover the mounting hole and being fixed to the mounting member, and a restricting member movably attached to the lid, the restricting member being movable between a restriction position for engaging with the mounting member and a non-restriction position for releasing from the mounting member.

11 Claims, 24 Drawing Sheets

(56) References Cited

U.S. PATENT DOCUMENTS

| | | | |
|---|---|---|---|
| 8,040,687 B2* | 10/2011 | Pirillis | H05K 7/1412 |
| | | | 361/801 |
| 9,769,941 B2* | 9/2017 | Butterbaugh | H05K 5/0221 |
| 10,015,904 B2* | 7/2018 | Kull | H05K 7/20581 |
| 10,485,123 B1* | 11/2019 | Lin | H05K 7/1409 |
| 2003/0221291 A1* | 12/2003 | Stewart | H05K 7/20172 |
| | | | 16/422 |
| 2004/0008484 A1* | 1/2004 | Konshak | G06F 1/184 |
| | | | 361/679.5 |
| 2007/0064385 A1* | 3/2007 | Paul | G06F 1/187 |
| | | | 361/679.4 |
| 2007/0223207 A1* | 9/2007 | Nguyen | G06F 1/181 |
| | | | 361/801 |
| 2016/0157380 A1* | 6/2016 | Kull | H05K 7/20581 |
| | | | 211/26 |
| 2017/0055354 A1* | 2/2017 | Meunier | H05K 7/20136 |
| 2017/0112008 A1* | 4/2017 | Zhu | H05K 5/0221 |
| 2019/0335615 A1* | 10/2019 | Zhai | H05K 7/20727 |

FOREIGN PATENT DOCUMENTS

| | | | |
|---|---|---|---|
| CN | 104684338 | A | 6/2015 |
| JP | 559889 | U | 8/1993 |
| JP | 2007191205 | A | 8/2007 |
| JP | 200927776 | A | 2/2009 |
| JP | 2011166969 | A | 8/2011 |
| JP | 2011222740 | A | 11/2011 |
| JP | 2015225499 | A | 12/2015 |
| JP | 2017139305 | A | 8/2017 |
| RO | 127243 | A2 | 3/2012 |

OTHER PUBLICATIONS

Untranslated Decision to Grant a Patent mailed by Japan Patent Office (JPO) for Application No. 2017-214946, dated Sep. 24, 2019, 3 pgs.
English Machine Translation of Decision to Grant a Patent mailed by Japan Patent Office (JPO) for Application No. 2017-214946, dated Sep. 24, 2019, 2 pgs.
Untranslated Notice of Reasons for Refusal mailed by Japan Patent Office (JPO) for Application No. 2017-214946, dated Jun. 18, 2019, 5 pgs.
English Machine Translation of Notice of Reasons for Refusal mailed by Japan Patent Office (JPO) for Application No. 2017-214946, dated Jun. 18, 2019, 6 pgs.
English Abstract and Machine Translation for Japanese Publication No. H05-059889 U, published Aug. 6, 1993, 26 pgs.
English Abstract and Machine Translation for Japanese Publication No. 2007-191205 A, published Aug. 2, 2007, 31 pgs.
English Abstract and Machine Translation for Japanese Publication No. 2011-166969 A, published Aug. 25, 2011, 21 pgs.
English Abstract and Machine Translation for Japanese Publication No. 2011-222740 A, published Nov. 4, 2011, 27 pgs.
English Abstract and Machine Translation for Japanese Publication No. 2015-225499 A, published Dec. 14, 2015, 28 pgs.
English Abstract and Machine Translation for Japanese Publication No. 2017-139305 A, published Aug. 10, 2017, 21 pgs.
English Abstract and Machine Translation for Chinese Publication No. CN101395393A, published Mar. 25, 2009, 34 pgs.
English Abstract and Machine Translation for Romanian Publication No. RO127243A2, published Mar. 30, 2012, 3 pgs.
English Abstract and Machine Translation for Chinese Publication No. CN103155729A, published Jun. 12, 2013, 12 pgs.
English Abstract and Machine Translation for Chinese Publication No. CN104684338A, published Jun. 3, 2015, 25 pgs.

* cited by examiner

FIG. 17A
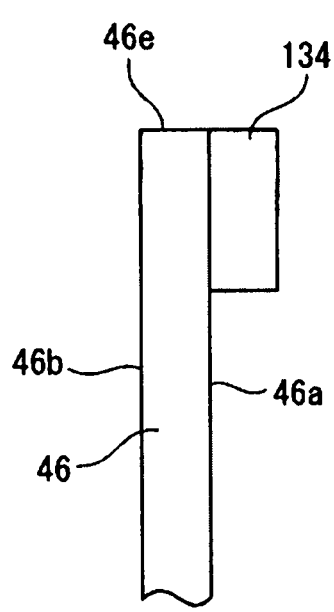
FIG. 17B
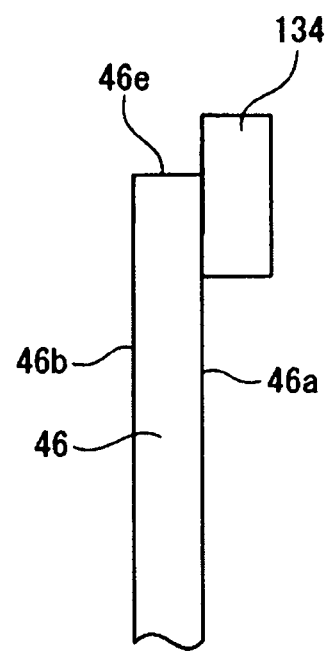
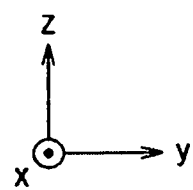

FIG. 19
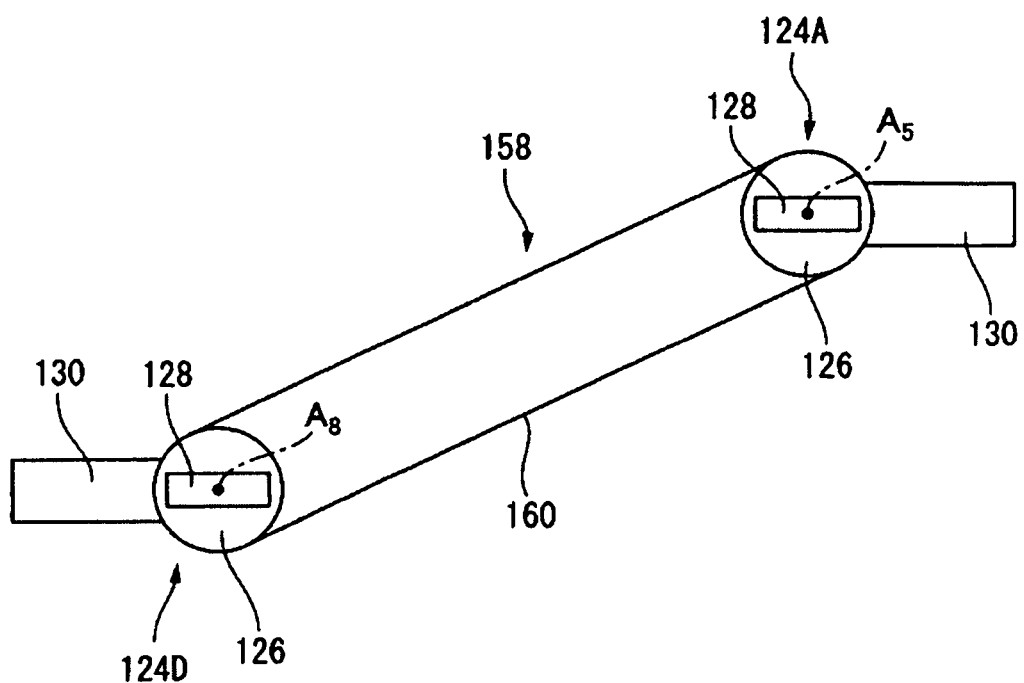
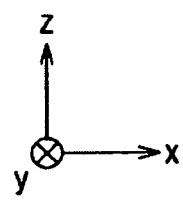

ically the mounting member 12 is fixed to the
partition wall B by a fastener such as a bolt.

MOTOR DRIVE DEVICE INCLUDING FAN UNIT

BACKGROUND OF THE INVENTION

1. Field of the Invention

The invention relates to a motor drive device including a fan unit.

2. Description of the Related Art

A motor drive device including a mounting member provided on a high-voltage cabinet and a fan unit fixed to the mounting member is known (e.g., JP 2009-027776 A).

In the related art, there is a demand for a technology that makes it easier to install a fan unit on a mounting member.

SUMMARY OF THE INVENTION

In an aspect of the present disclosure, the motor drive device includes a mounting member formed with a mounting hole; a fan unit fixed to the mounting member and including a lid disposed to face the mounting member so as to cover at least a part of the mounting hole; and at least one restricting member attached to the lid so as to be movable with respect to the lid, the restricting member being movable between a restriction position, in which the restricting member engages the mounting member and restricts the lid from moving in a separating direction away from the mounting member, and a non-restriction position, in which the restricting member disengages from the mounting member and allows the lid to move in the separating direction.

According to the present disclosure, since the lid can be fixed to the mounting member by the restricting member attached to the lid without using fasteners such as bolts, an operation to attach and detach the fan unit to and from the mounting member can be simplified.

BRIEF DESCRIPTION OF THE DRAWINGS

FIGS. 17A and 17B are views for explaining a restricting member according to another embodiment.

FIG. 19 is a schematic view for explaining an interlocking mechanism according to another embodiment.

DETAILED DESCRIPTION

Figure 1:
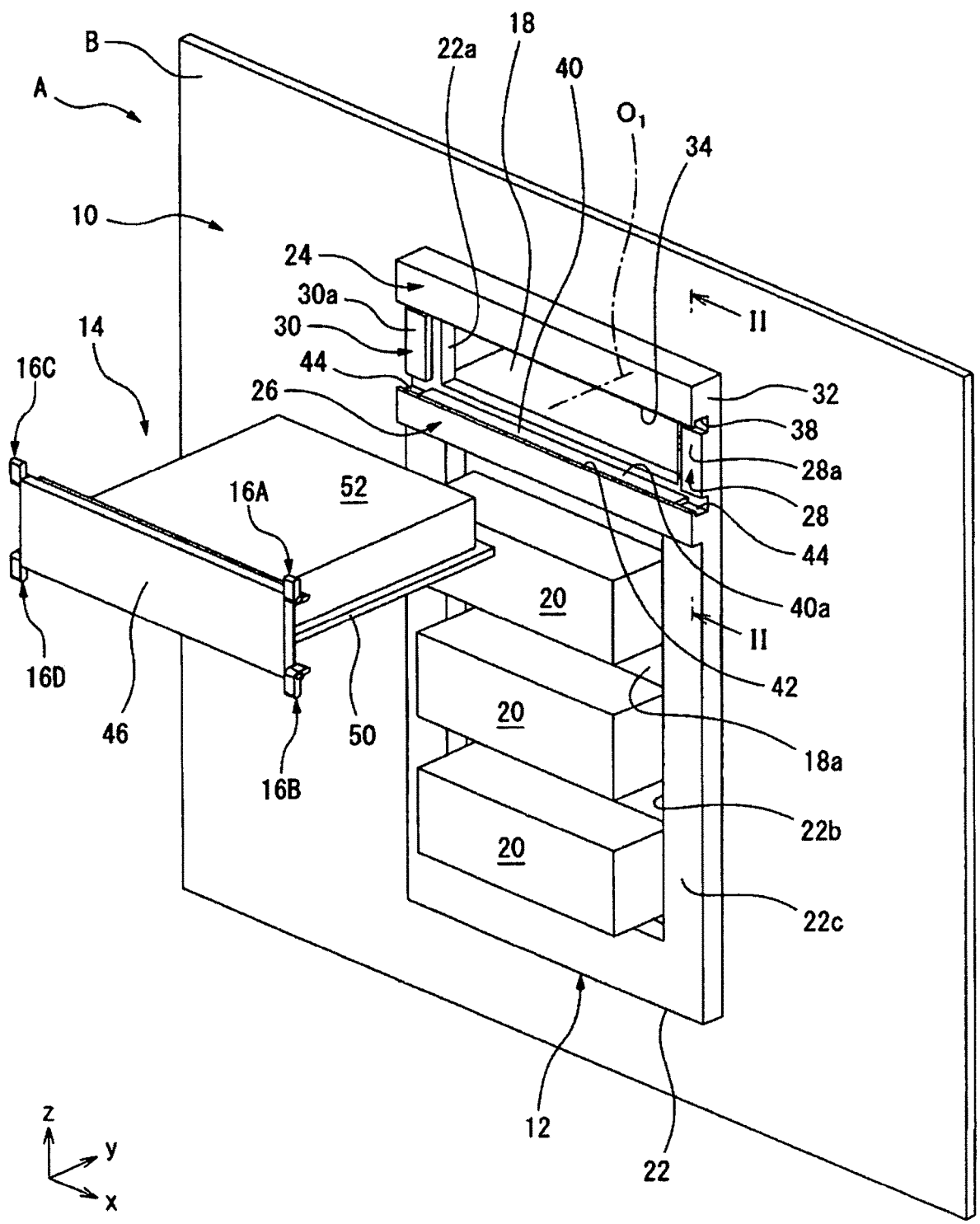
FIG. 1 is a perspective view of a motor drive device according to an embodiment.

Embodiments of the present disclosure will be described in detail below with reference to the drawings. Note that, in the various embodiments described below, the same reference numerals are given to similar elements, and redundant descriptions thereof will be omitted. Further, in the following description, an orthogonal coordinate system shown in the drawings is a reference of directions, and for the sake of convenience, the x-axis positive direction is referred to as rightward direction, the y-axis positive direction is referred to as frontward direction, and the z-axis positive direction is referred to as upward direction.

A motor drive device 10 according to an embodiment is described with reference to FIGS. 1 to 5. The motor drive device 10 is housed inside a hollow high-voltage cabinet A. The cabinet A includes a partition wall B, to which the motor drive device 10 is fixed. In FIG. 1, only a part of the partition wall B is illustrated.

The motor drive device 10 includes a mounting member 12, a fan unit 14, restricting members 16A, 16B, 16C and 16D, a heat sink 18, and power elements 20. The mounting member 12 is fitted into an opening C (FIG. 2) formed in the partition wall B, and fixed to the partition wall B by a fastener (not illustrated) such as a bolt.

The mounting member 12 includes a base plate 22, an upper holding section 24, a lower holding section 26, a right abutting section 28, and a left abutting section 30. The base plate 22 has a substantially rectangular outer shape elongated in the z-axis direction when viewed from the rear side, and is fixed to the rear side of the partition wall B.

The base plate 22 is formed with a mounting hole 22a and an opening 22b penetrating the base plate 22 in the y-axis direction. The mounting hole 22a and the opening 22b are in communication with the opening C formed in the partition wall B.

The mounting hole 22a has a substantially rectangular outer shape elongated in the x-axis direction when viewed from the rear side. Further, the mounting hole 22a has a center axis $O_1$ parallel to the y-axis. The opening 22b has a substantially rectangular outer shape elongated in the z-axis direction when viewed from the rear side, and is disposed separate downward from the mounting hole 22a.

Figure 2:
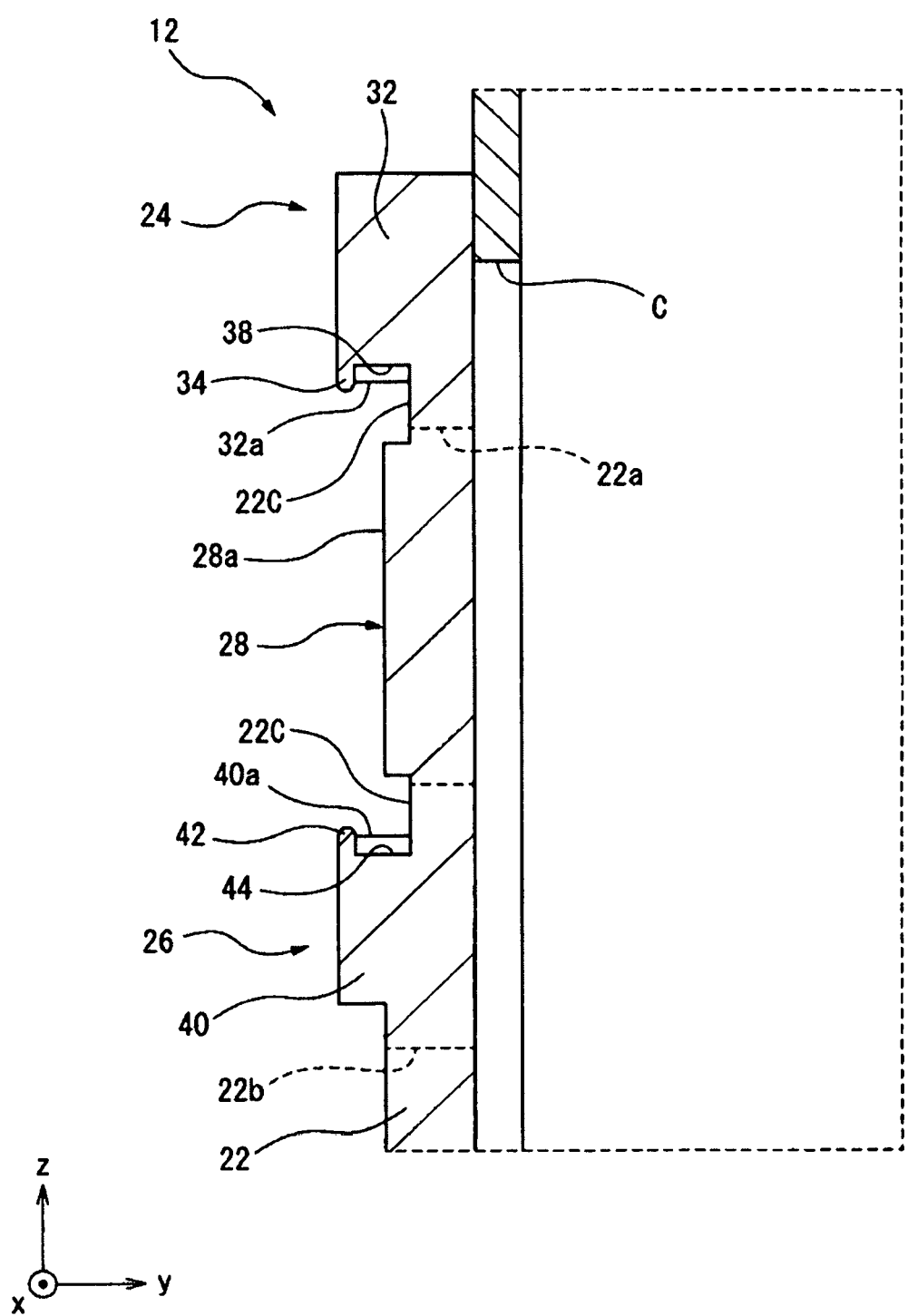
FIG. 2 is a cross-sectional view taken along a plane parallel to the y-z plane passing through II-II in FIG. 1.

As illustrated in FIG. 2, the upper holding section 24 is provided on the base plate 22 so as to be adjacent to the upper side of the mounting hole 22a. More specifically, the upper holding section 24 includes a base 32 protruding rearward from a rear surface 22c of the base plate 22, and a protrusion 34 protruding downward from the rear end of the base 32.

A pair of recesses 38 recessed upward from the bottom surface 32a are formed at respective left and right ends of a bottom surface 32a of the base 32. Note that, in FIG. 1 and FIG. 2, only one of the pair of recesses 38 on the right side is illustrated.

The lower holding section 26 is provided on the base plate 22 so as to be adjacent to the lower side of the mounting hole 22a, and has a shape symmetrical with the upper holding section 24 with respect to the x-y plane. Specifically, the lower holding section 26 includes a base 40 that protrudes rearward from the rear surface 22c of the base plate 22, and a protrusion 42 that protrudes upward from the rear end of the base 40. A pair of recesses 44 recessed downward from the top surface 40a are formed at respective left and right ends of a top surface 40a of the base 40.

The right and left abutting sections 28 and 30 having the same shape of a substantially rectangular flat plate elongated in the z-axis direction when viewed from the rear side. The right abutting section 28 is provided so as to protrude rearward from the rear surface 22c of the base plate 22, and disposed adjacent to the right side of the mounting hole 22a.

The left abutting section 30 is provided so as to protrude rearward from the rear surface 22c of the base plate 22, and disposed adjacent to the left side of the mounting hole 22a. In this embodiment, a rear surface 28a of the right abutting section 28 and a rear surface 30a of the left abutting section 30 are substantially parallel to the x-z plane.

Figure 3:
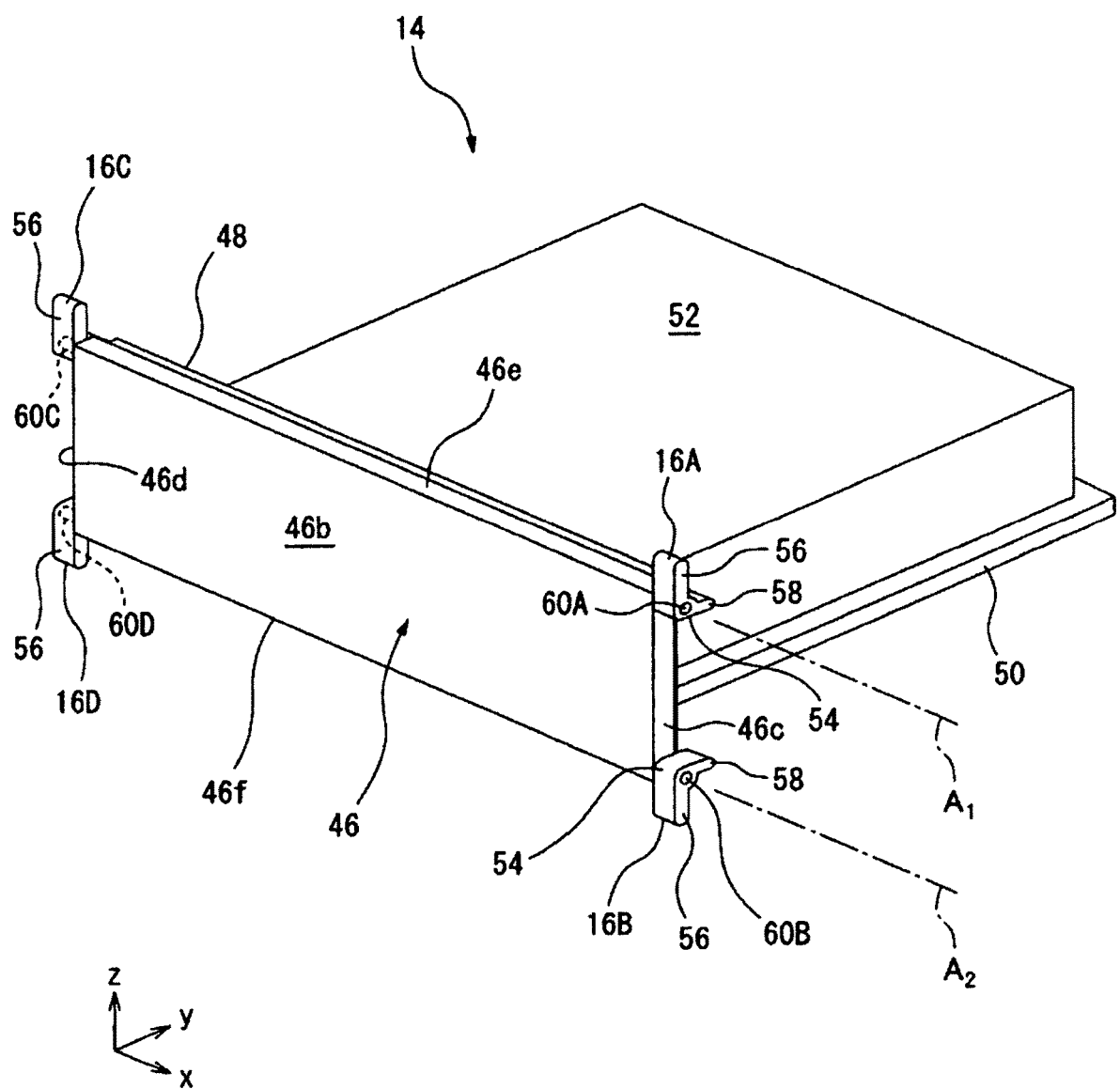
FIG. 3 is an enlarged perspective view of the fan unit illustrated in FIG. 1.
Figure 4:
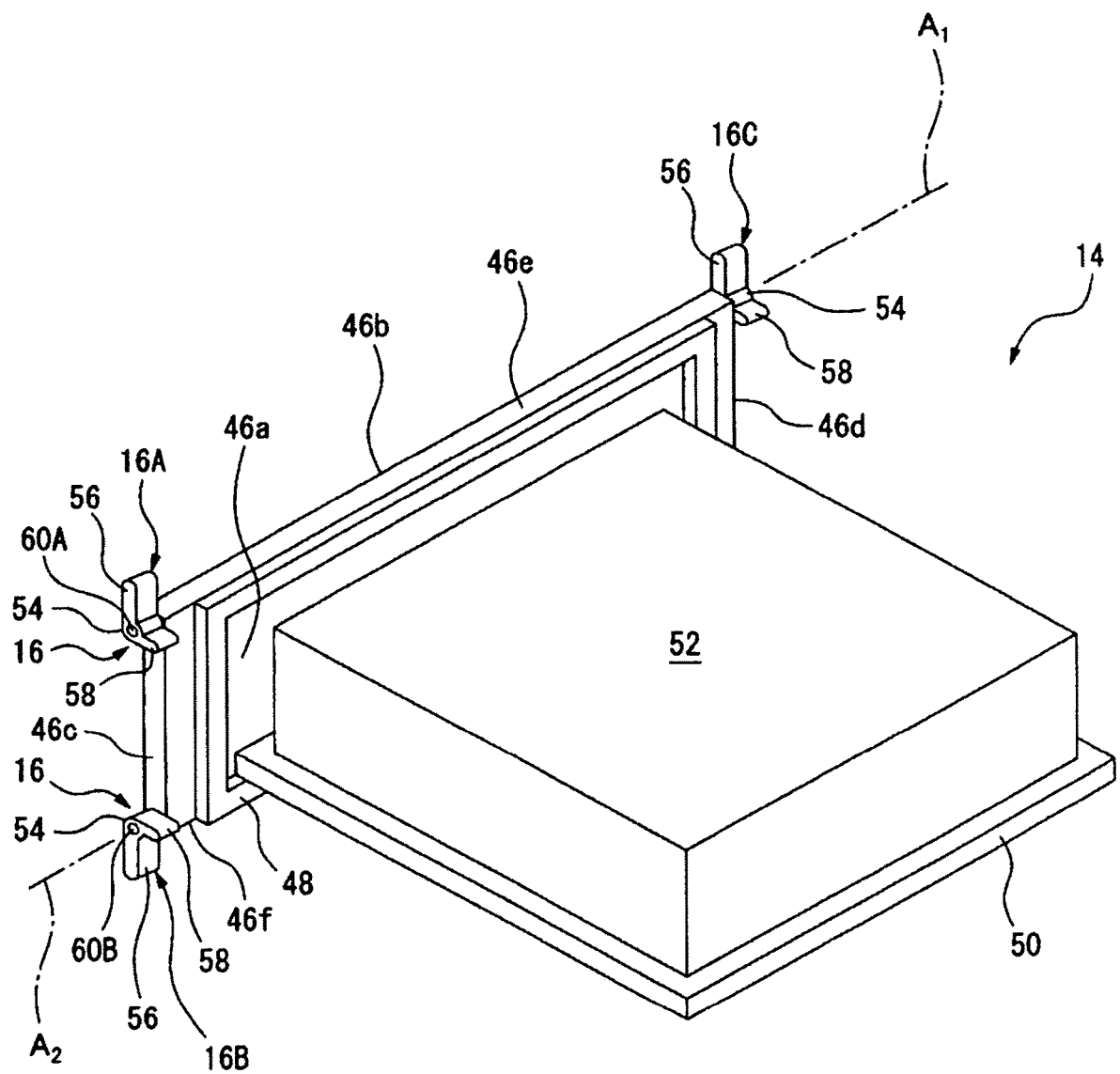
FIG. 4 is an enlarged perspective view of the fan unit illustrated in FIG. 3 as viewed from the front side.
Figure 5:
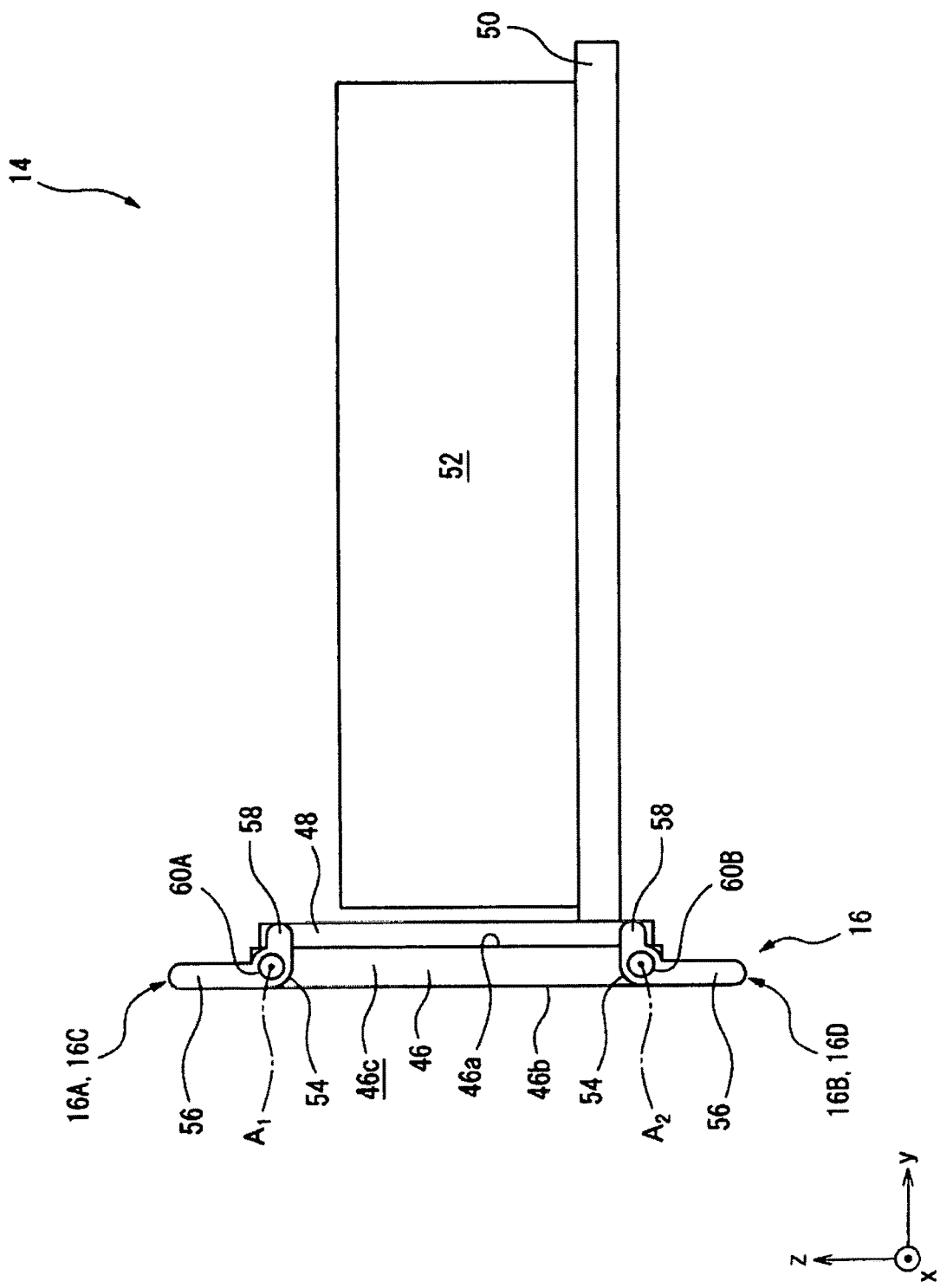
FIG. 5 is a side view of the fan unit illustrated in FIG. 3 as viewed from the right side.

As illustrated in FIGS. 3 to 5, the fan unit 14 includes a lid 46, a sealing member 48, a fan support section 50, and a fan main body 52. The lid 46 is a substantially rectangular flat plate member elongated in the x-axis direction when viewed from the rear side, and includes a front surface 46a, a rear surface 46b, a right side surface 46c, a left side surface 46d, a top surface 46e, and a bottom surface 46f.

Shafts 60A and 60B are fixed on the right side surface 46c of the lid 46. These shafts 60A and 60B are provided so as to protrude rightward from the right side surface 46c.

Similarly, shafts 60C and 60D (FIG. 3) are fixed on the left side surface 46d of the lid 46. These shafts 60C and 60D are provided so as to protrude leftward from the left side surface 46d. The shafts 60A and 60C are disposed adjacent to the top surface 46e of the lid 46, while the shafts 60B and 60D are disposed adjacent to the bottom surface 46f of the lid 46.

The shafts 60A and 60C are centered about an axis $A_1$ and extend along the axis $A_1$. In addition, the lower shafts 60B and 60D are centered about an axis $A_2$ and extend along the axis $A_2$. The axes $A_1$ and $A_2$ are substantially parallel to the x-axis (i.e., orthogonal to the axis $O_1$), and are spaced apart from each other in the z-axis direction.

The sealing member 48 is provided on the front surface 46a of the lid 46. The sealing member 48 is an annular member extending along the outer peripheral edge of the lid 46 so as to surround the center part of the lid 46. The sealing member 48 is made of e.g. an elastic material such as rubber.

The fan support section 50 is an annular plate member having a substantially rectangular outer shape, and its rear end is fixed to the front surface 46a of the lid 46. A vent hole (not illustrated) penetrating the fan support section 50 in the z-axis direction is formed in the fan support section 50.

The fan main body 52 is installed on the fan support section 50. The fan main body 52 includes a rotary body (not illustrated) having a plurality of blades, and a motor (not illustrated) configured to rotate the rotary body. The fan main body 52 generates an air flow that flows in the heat sink 18 through the vent hole of the fan supporting section 50. In this embodiment, the fan main body 52 is arranged to be spaced forward from the front surface 46a of the lid 46.

The motor drive device 10 of this embodiment includes a total of four restricting members 16A, 16B, 16C, and 16D. These restricting members 16A, 16B, 16C and 16D are independent members separate from the lid 46, and have the same shape as each other.

Specifically, each of the restricting members 16A, 16B, 16C, and 16D includes a cylindrical section 54, a gripping section 56, and an engaging section 58. The gripping section 56 extends from the cylindrical section 54 in a direction. The engaging section 58 extends from the cylindrical section 54 in a direction substantially perpendicular to the extension direction of the gripping section 56.

The restricting member 16A is rotatably fitted to the shaft 60A such that the shaft 60A is inserted into the cylindrical section 54 of the restricting member 16A, whereby, the restricting member 16A is attached to the right side surface 46c of the lid 46 so as to be rotatable about the axis $A_1$.

Further, the restricting member 16B is rotatably fitted to the shaft 60B such that the shaft 60B is inserted into the cylindrical section 54 of the restricting member 16B, whereby, the restricting member 16B is attached to the right side surface 46c of the lid 46 so as to be rotatable about the axis $A_2$.

Further, the restricting member 16C is rotatably fitted to the shaft 60C such that the shaft 60C is inserted into the cylindrical section 54 of the restricting member 16C, whereby, the restricting member 16C is attached to the left side surface 46d of the lid 46 so as to be rotatable about the axis $A_1$.

Further, the restricting member 16D is rotatably fitted to the shaft 60D such that the shaft 60D is inserted into the cylindrical section 54 of the restricting member 16D, whereby, the restricting member 16D is attached to the right side surface 46d of the lid 46 so as to be rotatable about the axis $A_2$.

Referring to FIG. 1 again, the heat sink 18 is fixed to the front side of the base plate 22, and is disposed just below the fan main body 52. The power elements 20 are attached to a rear surface 18a of the heat sink 18, and exposed to the space on rear side of the partition wall B through the opening 22b of the base plate 22. The heat generated in the power element 20 during operation of the motor drive device 10 is conducted to the heat sink 18 and radiated there.

Next, with reference to FIG. 1, FIG. 6, and FIG. 7, a method of attaching and detaching the fan unit 14 to and from the mounting member 12 will be described. When attaching the fan unit 14 to the mounting member 12, the operator first places the restricting members 16A to 16D in the positions illustrated in FIG. 1 and FIG. 6. In this state, the extension direction of the engaging section 58 of each of the restricting members 16A to 16D is substantially parallel to the y-axis.

Figure 6:
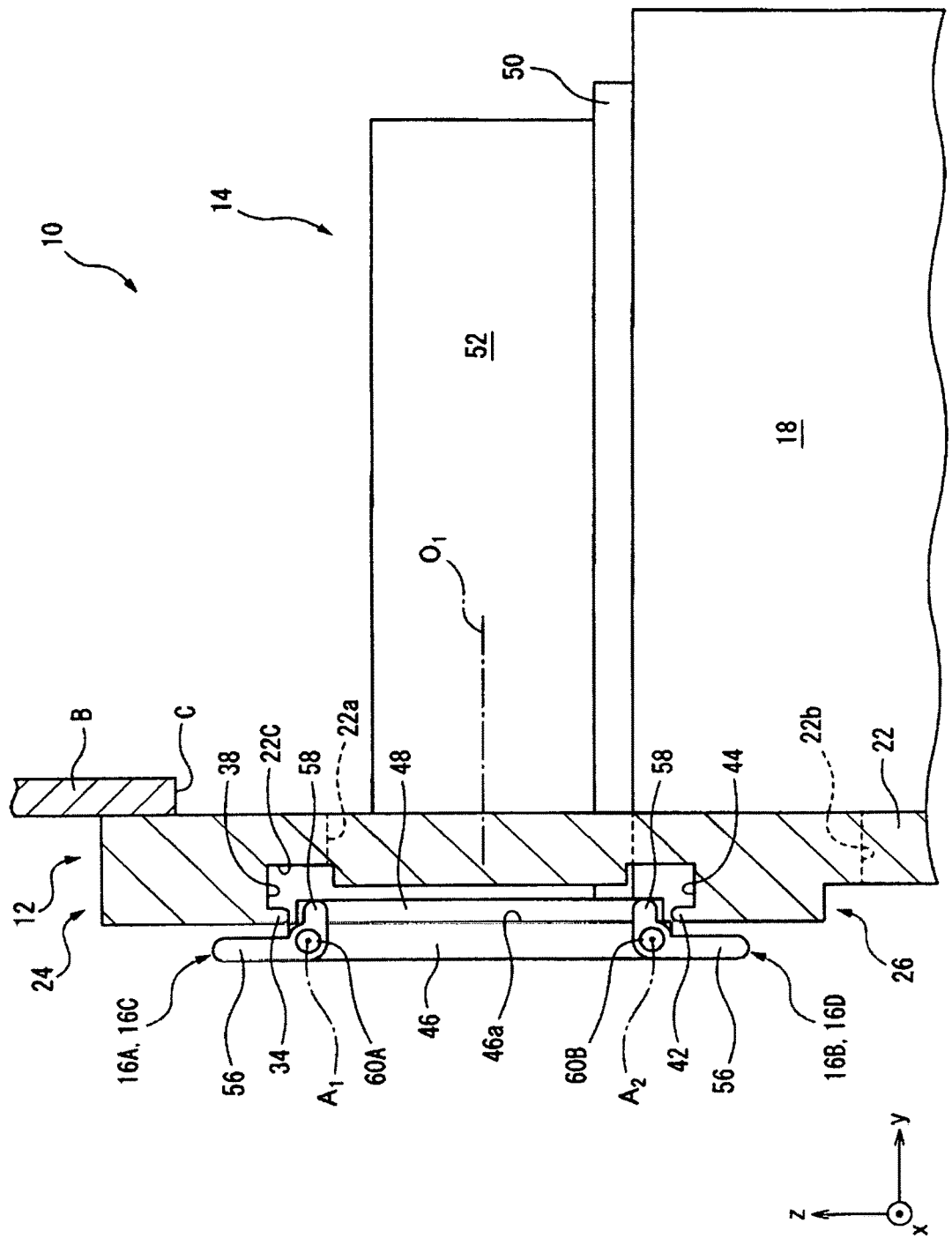
FIG. 6 is a partial cross-sectional view illustrating a state in which a fan unit is inserted into a mounting hole and a restricting member is positioned in a non-restriction position.

Then, as illustrated in FIG. 6, the operator insert the fan support section 50 and the fan main body 52 into the mounting hole 22a from the rear side, and pushes them forward along the axis $O_1$. At this time, the sealing member 48 provided on the front surface 46a of the lid 46 contacts the rear surface 22c of the base plate 22.

Then, the operator grips the gripping sections 56 of the restricting members 16A and 16C and rotates the restricting members 16A and 16C about the axis $A_1$ in the counter-clockwise direction as viewed from the right side. Further, the operator grips the gripping sections 56 of the restricting members 16B and 16D and rotates the restricting members 16B and 16D about the axis $A_2$ in the clockwise direction as viewed from the right side.

Figure 7:
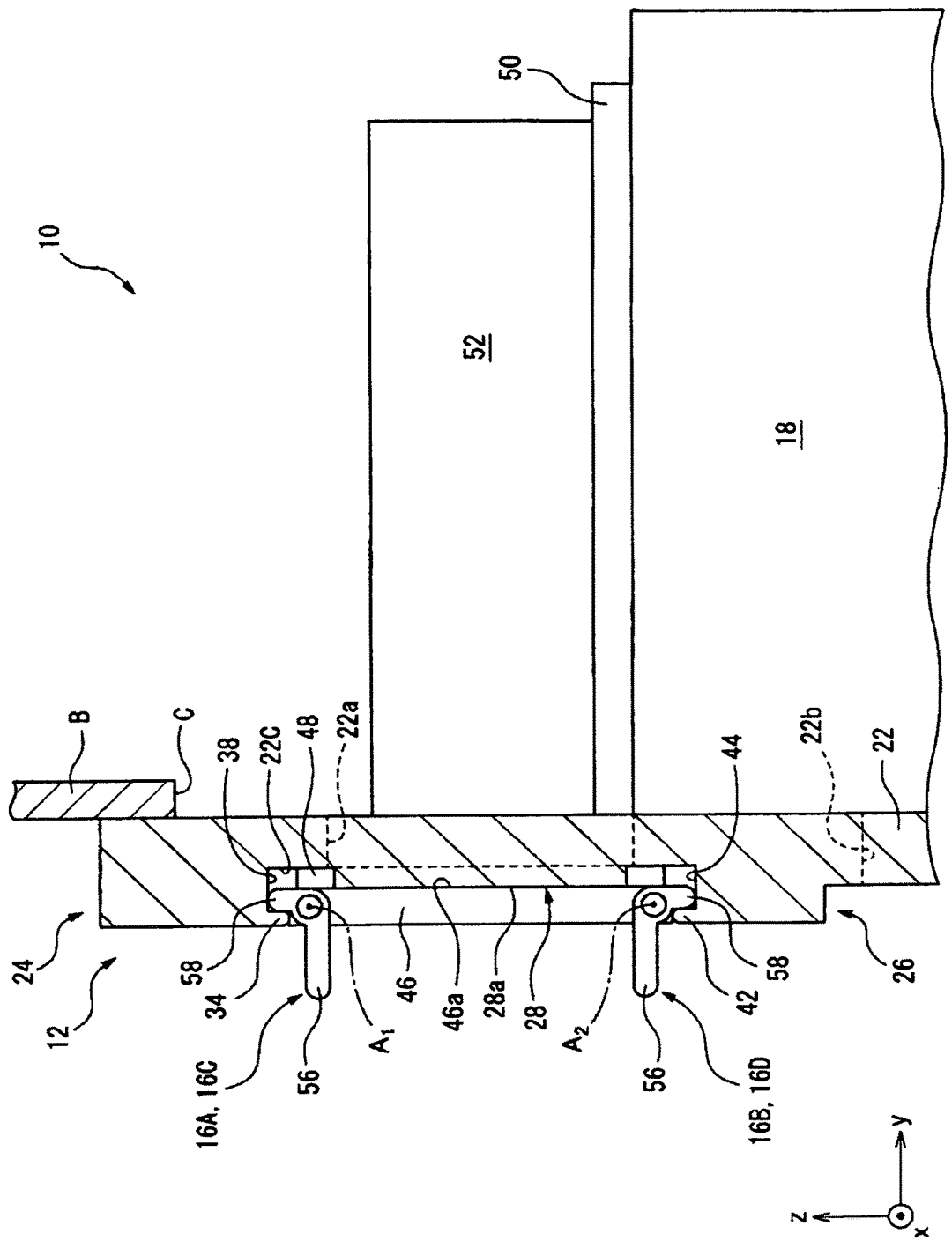
FIG. 7 is a partial cross-sectional view illustrating a state in which the restricting member illustrated in FIG. 6 is positioned in a restriction position and the fan unit is fixed to a mounting member.

By this operation, as illustrated in FIG. 7, the engaging sections 58 of the restricting members 16A and 16C are respectively inserted into the recesses 38, and contact and engage the protrusions 34 of the upper holding section 24 from the front side. Further, the engaging sections 58 of the restricting members 16B and 16D are respectively inserted into the recesses 44, and contact and engage the protrusions 42 of the lower holding section 26 from the front side.

By the restricting members 16A to 16D thus engaging the mounting member 12, the lid 46 is restricted from moving rearward so as to separate away from the mounting member 12. Thus, the positions of the restricting members 16A to 16D illustrated in FIG. 7 each correspond to a restriction position.

When the operator rotates the restricting members 16A to 16D to the restriction positions, the engaging sections 58 of the restricting members 16A to 16D press the protrusions 34 and 42, and as the reaction force of which, the protrusions 34 and 42 press the restricting members 16A to 16D forward. As a result, the lid 46 is pressed against the mounting member 12.

In the state illustrated in FIG. 7, the front surface 46a of the lid 46 comes into surface-contact with the rear surface 28a of the right abutting section 28 and the rear surface 30a of the left abutting section 30. Further, the sealing member 48 is held between the lid 46 and the rear surface 22c of the base plate 22, and seals a gap between the lid 46 and the base plate 22. In this manner, the mounting hole 22a is air-tightly closed by the lid 46 and the sealing member 48.

On the other hand, when detaching the fan unit 14 from the mounting member 12, the operator rotates the restricting members 16A to 16D disposed at the restriction positions illustrated in FIG. 7 in the direction opposite to the direction when attaching the fan unit 14.

Whereby, as illustrated in FIG. 6, the engaging sections 58 of the restricting members 16A and 16C are disengaged from the protrusions 34 of the upper holding section 24, and the engaging sections 58 of the restricting members 16B and 16D are disengaged from protrusions 42 of the lower holding section 26. As a result, the lid 46 is allowed to move rearward (i.e., in a direction separating away from the mounting member 12). Thus, the positions of the restricting members 16A to 16D illustrated in FIG. 6 each correspond to a non-restriction positions.

As described above, according to this embodiment, the lid 46 can be fixed to the mounting member 12 by the restricting members 16A to 16D attached to the lid 46 without fasteners such as bolts. Therefore, it is possible to simplify the work of attaching and detaching the fan unit 14 to and from the mounting member 12.

Further, in this embodiment, the restricting members 16A to 16D are attached to the lid 46 so as to be movable between the restriction position and the non-restriction position. According to this configuration, the operator can fix and unfix the lid 46 with respect to the mounting member 12 simply by moving the restricting members 16A to 16D between the restriction positions and the non-restriction positions.

Further, the operator can attach and detach the lid 46 to and from the mounting member 12 without a tool such as a driver. Further, the structure for fixing the lid 46 to the mounting member 12 can be simplified.

Further, in this embodiment, the restricting members 16A to 16D are rotatably attached to the lid 46. According to this configuration, the operator can easily move the restricting members 16A to 16D between the restriction positions and the non-restriction positions.

Further, in this embodiment, the restricting members 16A to 16D are disposed at the four corners of the lid 46. According to this configuration, when the lid 46 is fixed to the mounting member 12 by the restricting members 16A to 16D, the sealing member 48 can be pressed against the mounting member with uniform surface pressure. Thus, it is possible to prevent distortion from occurring in the sealing member 48, and whereby, sealability of the mounting hole 22a by the sealing member 48 can be enhanced.

Next, with reference to FIGS. 8 to 10, a motor drive device 70 according to another embodiment will be described. The motor drive device 70 is different from the motor drive device 10 in the configuration of a mounting member 72 and the mounting positions of the restricting members 16A to 16D.

The mounting member 72 includes the base plate 22, an upper holding section 76, and a lower holding section 78. The upper holding section 76 is provided on the base plate 22 so as to be adjacent to the upper side of the mounting hole 22a.

Figure 9:
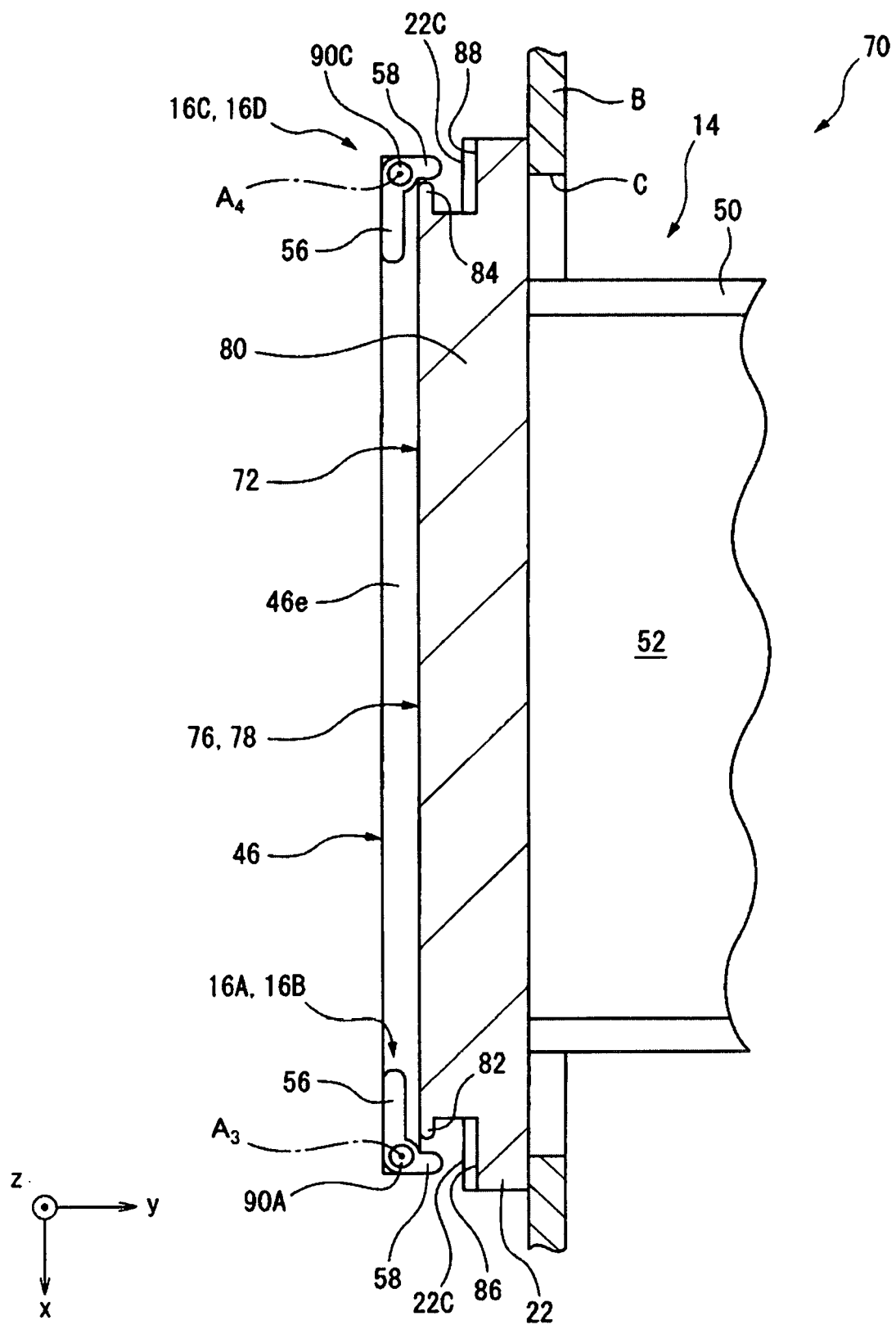
FIG. 9 is a partial cross-sectional view taken along a plane parallel to the x-y plane passing through IX-IX in FIG. 8, in which the fan unit is inserted into the mounting hole and the restricting member is in the non-restriction position.

As illustrated in FIG. 9, the upper holding section 76 includes a base 80 protruding rearward from the rear surface 22c of the base plate 22, a protrusion 82 protruding rightward from the rear end of the base 80, and a protrusion 84 protruding leftward from the rear end of the base 80. The lower holding section 78 has the same shape as the upper holding section 76. Specifically, the lower holding section 78 includes the base 80, the protrusion 82, and the protrusion 84.

On the right sides of the bases 80 of the upper and lower holding sections 76 and 78, recesses 86 recessed forward from the rear surface 22c of the base plate 22 are respectively formed. Also, on the left sides of the bases 80 of the upper and lower holding sections 76 and 78, recesses 88 recessed forward from the rear surface 22c of the base plate 22 are respectively formed.

Figure 10:
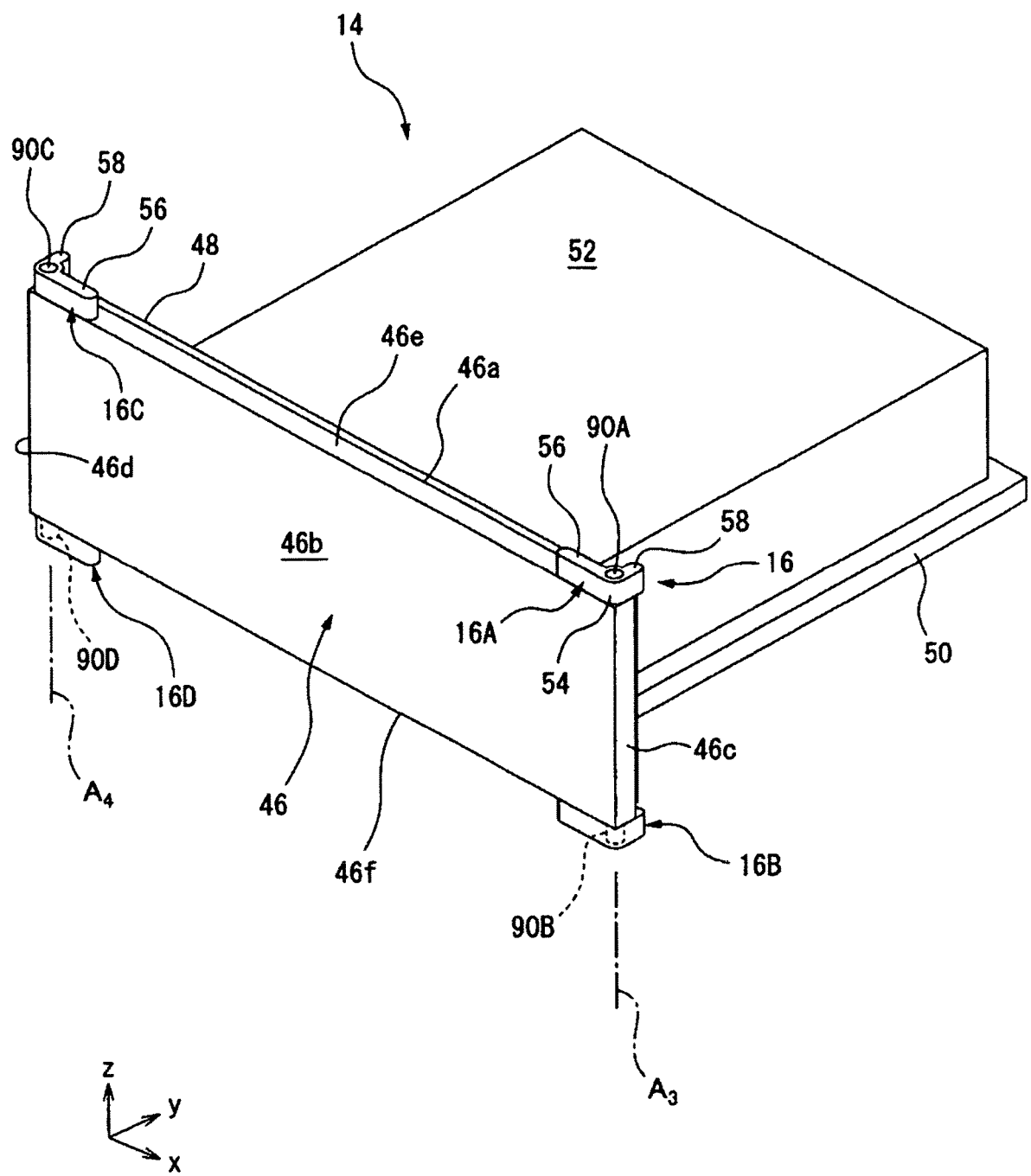
FIG. 10 is an enlarged perspective view of the fan unit illustrated in FIG. 8.

As illustrated in FIGS. 9 and 10, in this embodiment, shafts 90A and 90C are fixedly provided on the top surface 46e of the lid 46 so as to protrude upward from the top surface 46e. In addition, shafts 90B and 90D are fixedly provided on the bottom surface 46f of the lid 46 so as to protrude downward from the bottom surface 46f.

The shafts 90A and 90B are disposed adjacent to the right side surface 46c of the lid 46, while the shafts 90C and 90D are disposed adjacent to the left side surface 46d of the lid 46. The shafts 90A and 90B are centered about an axis $A_3$ and extend along the axis $A_3$.

The shafts 90C and 90D are centered about an axis $A_4$ and extend along the axis $A_4$. The axes $A_3$ and $A_4$ are substantially parallel to the z-axis (i.e., orthogonal to the axis $O_1$), and are spaced apart from each other in the x-axis direction.

The restricting member 16A is rotatably fitted to the shaft 90A such that the shaft 90A is inserted into the cylindrical section 54 of the restricting member 16A, whereby the restricting member 16A is attached to the top surface 46e of the lid 46 so as to be rotatable about the axis $A_3$.

Further, the restricting member 16B is rotatably fitted to the shaft 90B such that the shaft 90B is inserted into the cylindrical section 54 of the restricting member 16B, whereby the restricting member 16B is attached to the bottom surface 46f of the lid 46 so as to be rotatable about the axis $A_3$.

Further, the restricting member 16C is rotatably fitted to the shaft 90C such that the shaft 90C is inserted into the cylindrical section 54 of the restricting member 16C, whereby the restricting member 16C is attached to the top surface 46e of the lid 46 so as to be rotatable about the axis $A_4$.

Further, the restricting member 16D is rotatably fitted to the shaft 90D such that the shaft 90D is inserted into the cylindrical section 54 of the restricting member 16D, whereby the restricting member 16D is attached to the bottom surface 46f of the lid 46 so as to be rotatable about the axis $A_4$.

Next, a method of attaching and detaching the fan unit 14 to and from the mounting member 72 will be described with reference to FIGS. 8 to 11. When attaching the fan unit 14 to the mounting member 72, the operator first disposes the restricting members 16A to 16D in the positions illustrated in FIGS. 8 to 10. In this state, the extension direction of the engaging sections 58 of the restricting members 16A to 16D are substantially parallel to the y-axis.

Then, the operator inserts the fan support section 50 and the fan main body 52 into the mounting hole 22a from the rear side, and pushes them forward along the axis $O_1$. Due to this, the lid 46 is disposed at the position illustrated in FIG. 9.

Then, the operator grips the gripping sections 56 of the restricting members 16A and 16B, and rotates the restricting members 16A and 16B about the axis $A_3$ in the counterclockwise direction as viewed from the upper side. Further, the operator grips the gripping sections 56 of the restricting members 16C and 16D, and rotates the restricting members 16C and 16D about the axis $A_4$ in the clockwise direction as viewed from the upper side.

Figure 11:
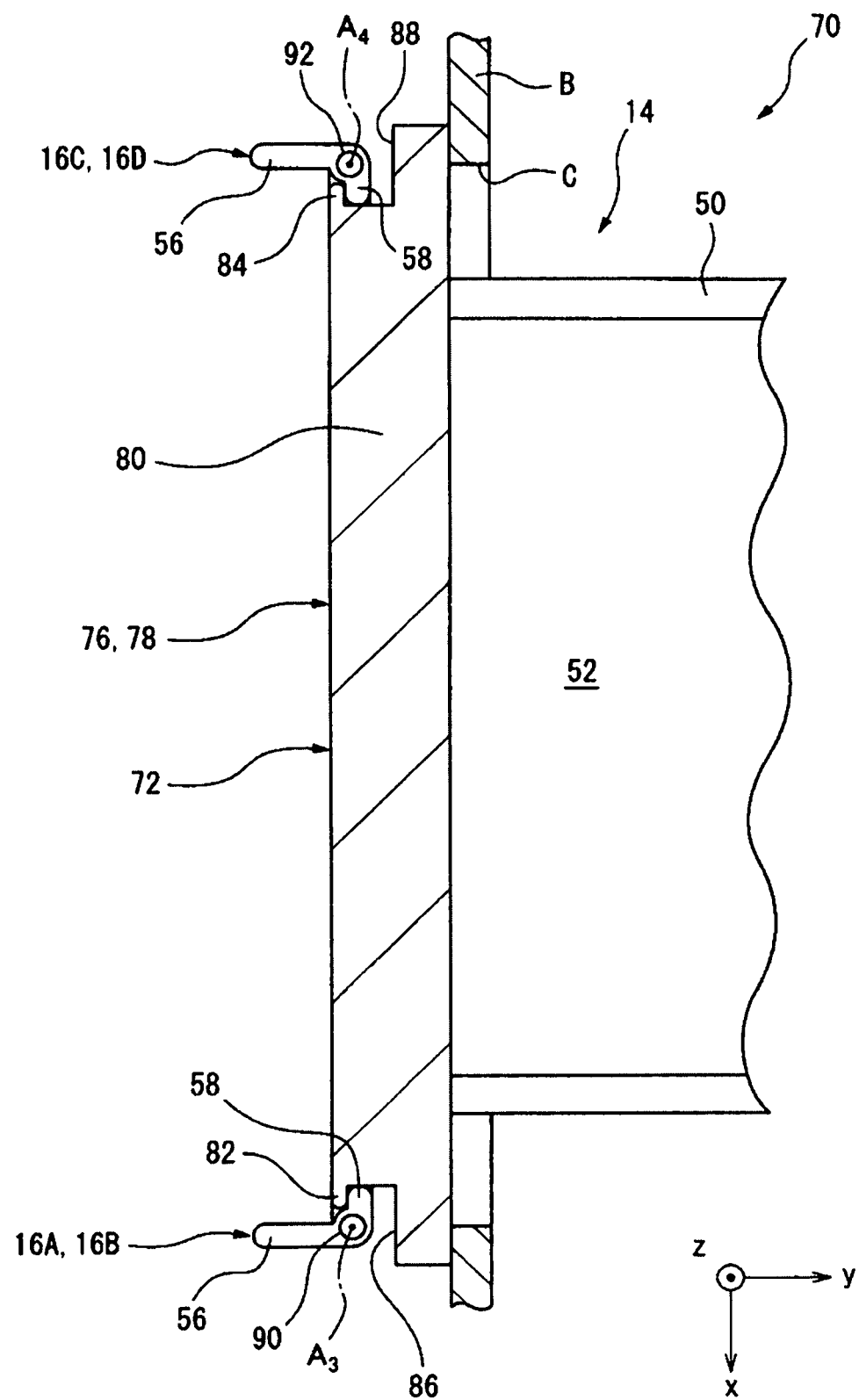
FIG. 11 is a partial cross-sectional view illustrating a state in which the restricting member illustrated in FIG. 9 is positioned in the restriction position and the fan unit is fixed to the mounting member.

By this operation, as illustrated in FIG. 11, the engaging sections 58 of the restricting members 16A and 16B are respectively inserted into the recesses 86, and contact and engage the protrusions 82 of the upper and lower holding sections 76 and 78 from the front side. Further, the engaging sections 58 of the restricting members 16C and 16D are respectively inserted into the recesses 88, and contact and engage the protrusions 84 of the upper and lower holding sections 76 and 78 from the front side.

By the restricting members 16A to 16D thus engaging the mounting member 72, the lid 46 is restricted from moving rearward to separate away from the mounting member 72. Thus, the positions of the restricting members 16A to 16D illustrated in FIG. 11 each correspond to a restriction position.

When the operator rotates the restricting members 16A to 16D to the restriction positions, the engaging sections 58 of the restricting members 16A to 16D press the protrusions 82 and 84, and as the reaction force of which, the protrusions 82 and 84 push the restricting members 16A to 16D forward. As a result, the lid 46 is pressed against the mounting member 72.

In the state illustrated in FIG. 11, the lid 46 is inserted between the upper holding section 76 and the lower holding section 78, and the front surface 46a of the lid 46 comes into surface-contact with the rear surface 22c of the base plate 22. Further, the sealing member 48 contacts the second rear surface 22d (FIG. 8) of the base plate 22, and is held between the lid 46 and the second rear surface 22d, and seals the gap between the lid 46 and the base plate 22.

In this embodiment, the second rear surface 22d is disposed at a position displaced forward from the rear surface 22c. In this manner, the mounting hole 22a is air-tightly closed by the lid 46 and the sealing member 48.

On the other hand, when detaching the fan unit 14 from the mounting member 72, the operator rotates the restricting members 16A to 16D disposed at the restriction positions illustrated in FIG. 11 in the direction opposite to the direction when attaching the fan unit 14.

Due to this, as illustrated in FIG. 9, the engaging sections 58 of the restricting members 16A and 16B are respectively disengaged from the protrusions 82 of the upper and lower holding sections 76 and 78, and the engaging sections 58 of the restricting members 16C and 16D are respectively disengaged from the protrusions 84 of the upper and lower holding sections 76 and 78.

As a result, the lid 46 is allowed to move rearward (i.e., in a direction separating away from the mounting member 72). Thus, the positions of the restricting members 16A to 16D illustrated in FIG. 9 each correspond to a non-restriction position.

As described above, according to this embodiment, the restricting members 16A to 16D are attached to the lid 46 so as to be rotatable between the restriction position and the non-restriction position. According to this configuration, similarly as the above-described embodiment, the operator can easily fix or unfix the lid 46 with respect to the mounting member 72.

Next, a motor drive device 100 according to another embodiment is described with reference to FIGS. 12 to 14. The motor drive device 100 differs from the above-described motor drive device 10 in a mounting member 102 and restricting members 124A to 124D.

The mounting member 102 includes the base plate 22, an upper holding section 106, and a lower holding section 108. The upper holding section 106 is provided on the base plate 22 so as to be adjacent to the upper side of the mounting hole 22a.

Figure 13:
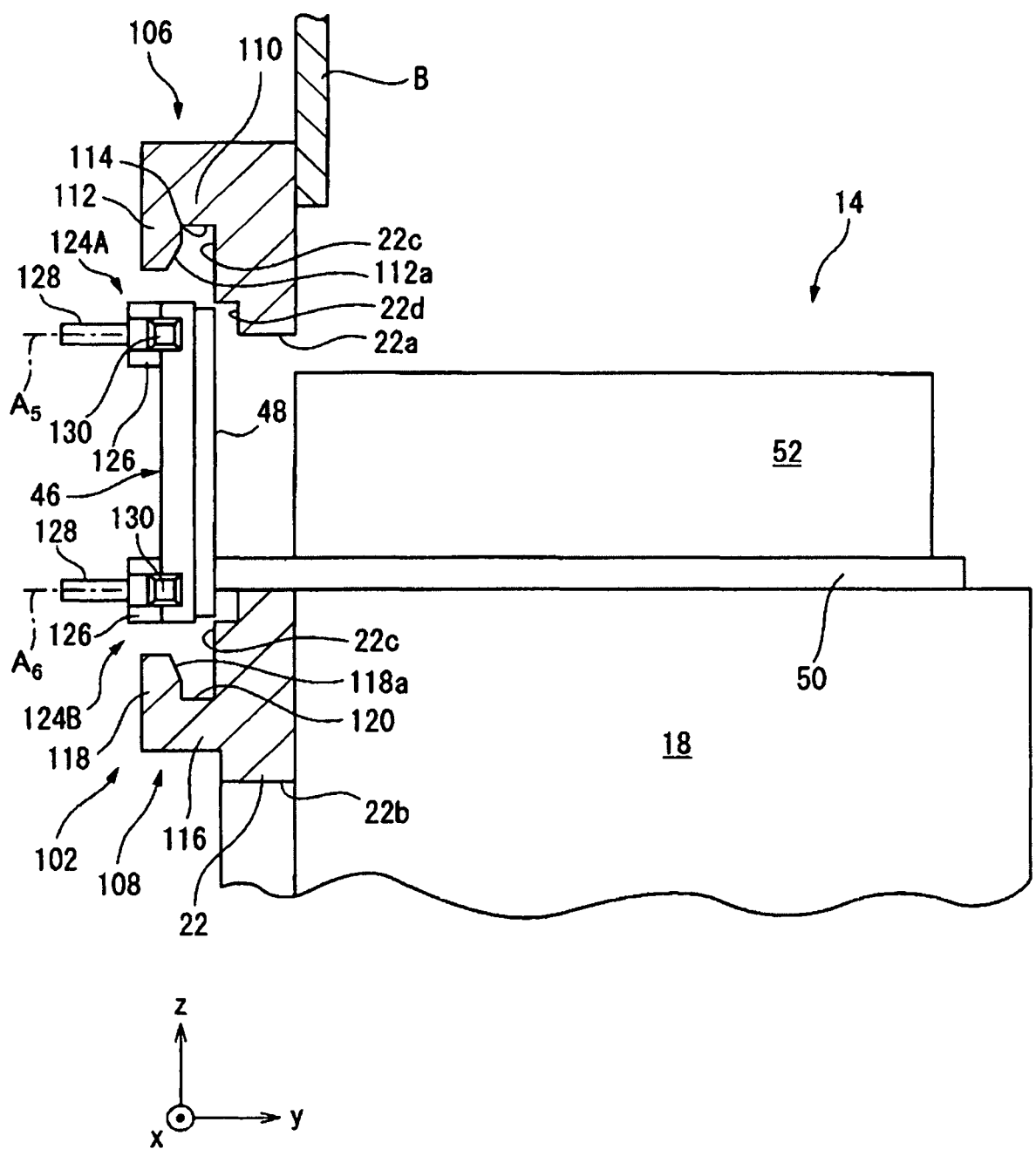
FIG. 13 is a partial cross-sectional view taken along a plane parallel to the y-z plane passing through XIII-XIII in FIG. 12, in which the fan unit is inserted into the mounting hole and the restricting member is in the non-restriction position.

As illustrated in FIG. 13, the upper holding section 106 includes a base 110 protruding rearward from the rear surface 22c of the base plate 22, and a protrusion 112 protruding downward from the rear end of the base 110. An inclined surface 112a is formed at a tip of the protrusion 112. The base 110 and the protrusion 112 define a recess 114 extending in the x-axis direction from the left end to the right end of the upper holding section 106.

The lower holding section 108 has a shape symmetrical with the upper holding section 106 with respect to the x-y plane. Specifically, the lower holding section 108 includes a base 116 protruding rearward from the rear surface 22c of the base plate 22, and a protrusion 118 protruding upward from the rear end of the base 116. An inclined surface 118a is formed at a tip of the protrusion 118. The base 116 and the protrusion 118 define a recess 120 extending in the x-axis direction from the left end to the right end of the lower holding section 108.

Figure 14:
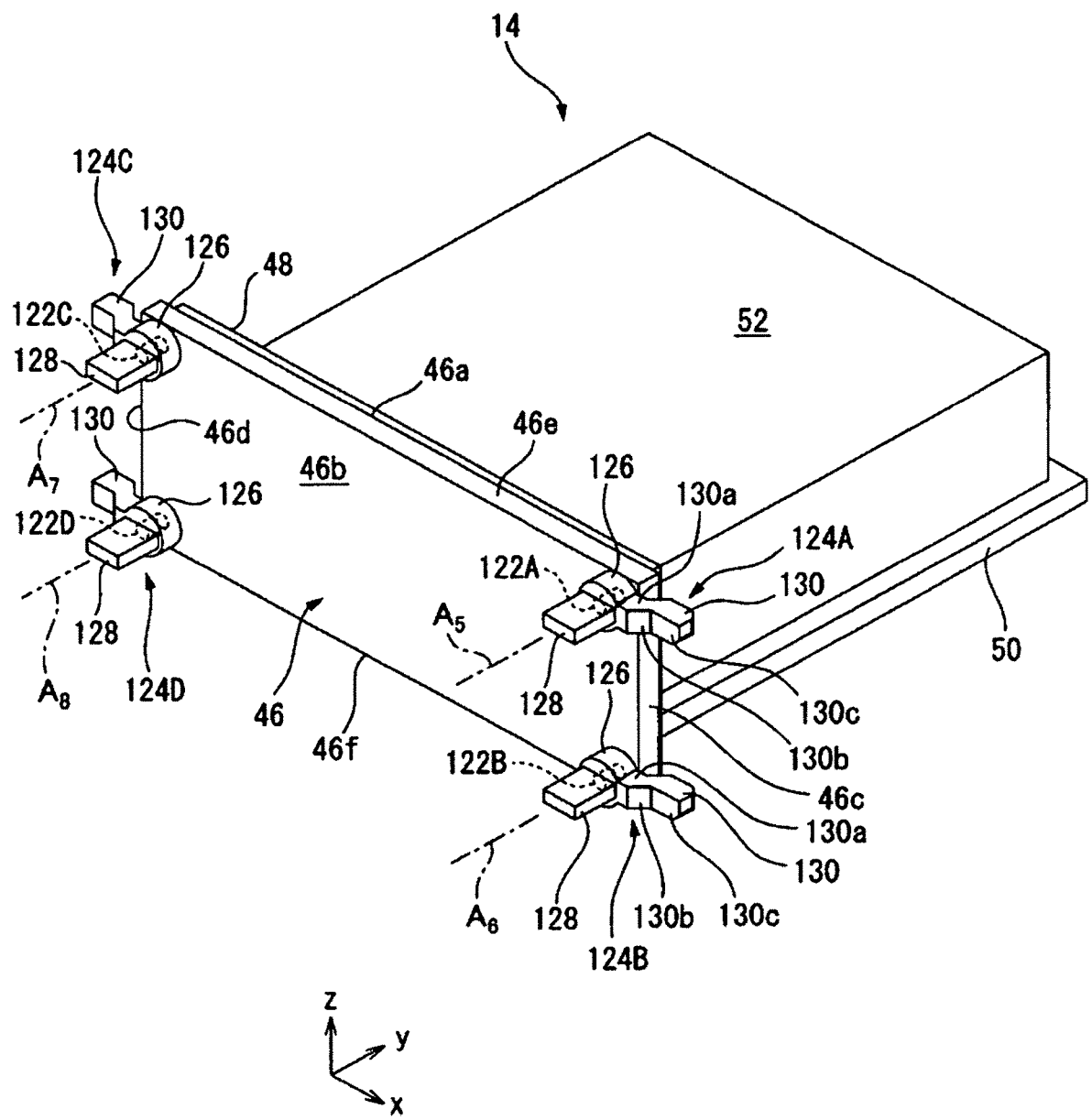
FIG. 14 is an enlarged perspective view of the fan unit illustrated in FIG. 12.

As illustrated in FIG. 14, in this embodiment, four shafts 122A, 122B, 122C, and 122D are fixedly provided on the rear surface 46b of the lid 46 so as to protrude rearward from the rear surface 46b.

The shaft 122A is disposed at the upper-right corner of the lid 46, i.e., adjacent to the right side surface 46c and the top surface 46e of the lid 46. The shaft 122A is centered about an axis $A_5$ and extends along the axis $A_5$. The axis $A_5$ is substantially parallel to the y-axis (i.e., the axis $O_1$).

The shaft 122B is disposed at the lower-right corner of the lid 46, i.e., adjacent to the right side surface 46c and the bottom surface 46f of the lid 46. The shaft 122B is centered about an axis $A_6$ and extends along the axis $A_6$. The axis $A_6$ is substantially parallel to the y-axis, and spaced apart downward from the axis $A_5$.

The shaft 122C is disposed at the upper-left corner of the lid 46, i.e., adjacent to the left side surface 46d and the top surface 46e of the lid 46. The shaft 122C is centered about an axis $A_7$ and extends along the axis $A_7$. The axis $A_7$ is substantially parallel to the y-axis, and spaced apart leftward from the axis $A_5$.

The shaft 122D is disposed at the lower-left corner of the lid 46, i.e., adjacent to the left side surface 46d and the bottom surface 46f of the lid 46. The shaft 122D is centered about an axis $A_8$ and extends along the axis $A_8$. The axis $A_8$ is substantially parallel to the y-axis, and is spaced apart downward from the axis $A_7$ and leftward from the axis $A_6$.

Figure 12:
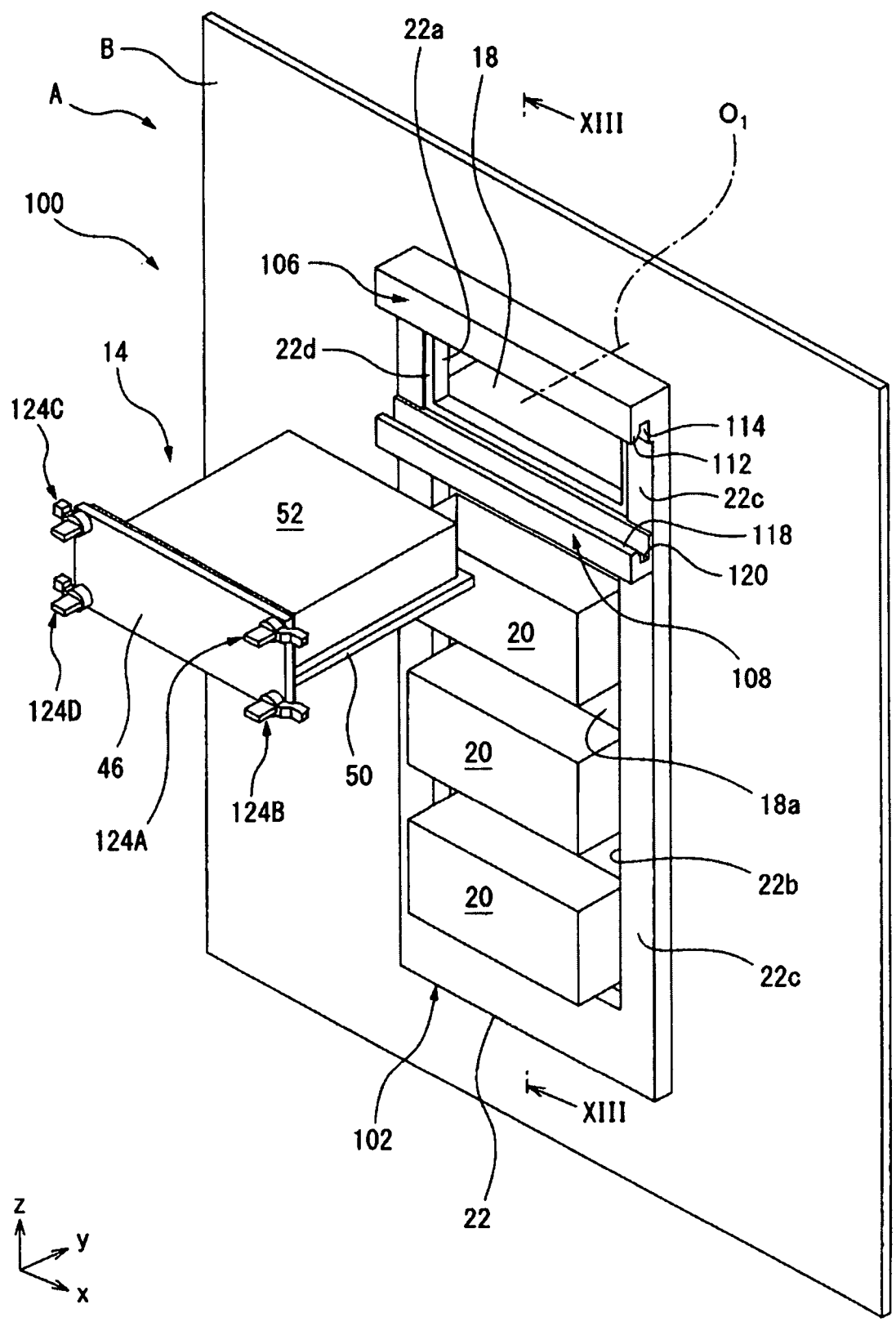
FIG. 12 is a perspective view of a motor drive device according to still another embodiment.

Referring to FIGS. 12 and 14, the motor drive device 100 includes a total of four restricting members 124A, 124B, 124C, and 124D. These restricting members 124A to 124D are members separate from the lid 46, and have the same shape as each other.

Specifically, each of the restricting members 124A to 124D includes a cylindrical section 126, a gripping section 128, and an engaging section 130. The gripping section 128 is a flat plate member extending from the cylindrical section 126 in a direction.

As illustrated in FIG. 14, the engaging section 130 includes a first portion 130a, a second portion 130b, and a third portion 130c. The first portion 130a extends from the cylindrical section 126 in a direction substantially perpendicular to the extension direction of the gripping section 128.

The second portion 130b extends from a distal end of the first portion 130a so as to be inclined with respect to the extension direction of the first portion 130a. The second portion 130b is inclined with respect to the extension direction of the first portion 130a so as to separate from the gripping section 128 as the second portion 130b separates from the cylindrical section 126. The third portion 130c extends from a distal end of the second portion 130b substantially in parallel with the extension direction of the first portion 130a.

The restricting member 124A is rotatably fitted to the shaft 122A such that the shaft 122A is inserted into the cylindrical section 126 of the restricting member 124A, whereby the restricting member 124A is attached to the rear surface 46b of the lid 46 so as to be rotatable about the axis $A_5$.

Further, the restricting member 124B is rotatably fitted to the shaft 122B such that the shaft 122B is inserted into the cylindrical section 126 of the restricting member 124B, whereby the restricting member 124B is attached to the rear surface 46b of the lid 46 so as to be rotatable about the axis $A_6$.

Further, the restricting member 124C is rotatably fitted to the shaft 122C such that the shaft 122C is inserted into the cylindrical section 126 of the restricting member 124C, whereby the restricting member 124C is attached to the rear surface 46b of the lid 46 so as to be rotatable about the axis $A_7$.

Further, the restricting member 124D is rotatably fitted in the shaft 122D such that the shaft 122D is inserted into the cylindrical section 126 of the restricting member 124D, whereby the restricting member 124D is attached to the rear surface 46b of the lid 46 so as to be rotatable about the axis $A_8$.

Next, with reference to FIG. 13 and FIG. 15, a method of attaching and detaching the fan unit 14 to and from the mounting member 102 will be described. When attaching the fan unit 14 to the mounting member 102, the operator first disposes the restricting members 124A to 124D in the positions illustrated in FIGS. 12 to 14. In this state, the extension direction of the engaging section 130 (more specifically, the first portion 130a and the third portion 130c) of each of the restricting members 124A to 124D is substantially parallel to the x-axis.

Then, the operator inserts the fan support section 50 and the fan main body 52 into the mounting hole 22a from the rear side, and pushed them forward along the axis $O_1$. Due to this, the lid 46 is disposed at the position illustrated in FIG. 13.

Then, the operator grips the gripping section 128 of the restricting member 124A and rotates the restricting member 124A about the axis $A_5$ in the counterclockwise direction as viewed from the rear side. Further, the operator grips the gripping section 128 of the restricting member 124B and rotates the restricting member 124B about the axis $A_6$ in the clockwise direction as viewed from the rear side.

Further, the operator grips the gripping section 128 of the restricting member 124C and rotates the restricting member 124C about the axis $A_7$ in the clockwise direction as viewed from the rear side. Further, the operator grips the gripping section 128 of the restricting member 124D and rotates the restricting member 124D about the axis $A_8$ in the counterclockwise direction as viewed from the rear side.

Figure 15:
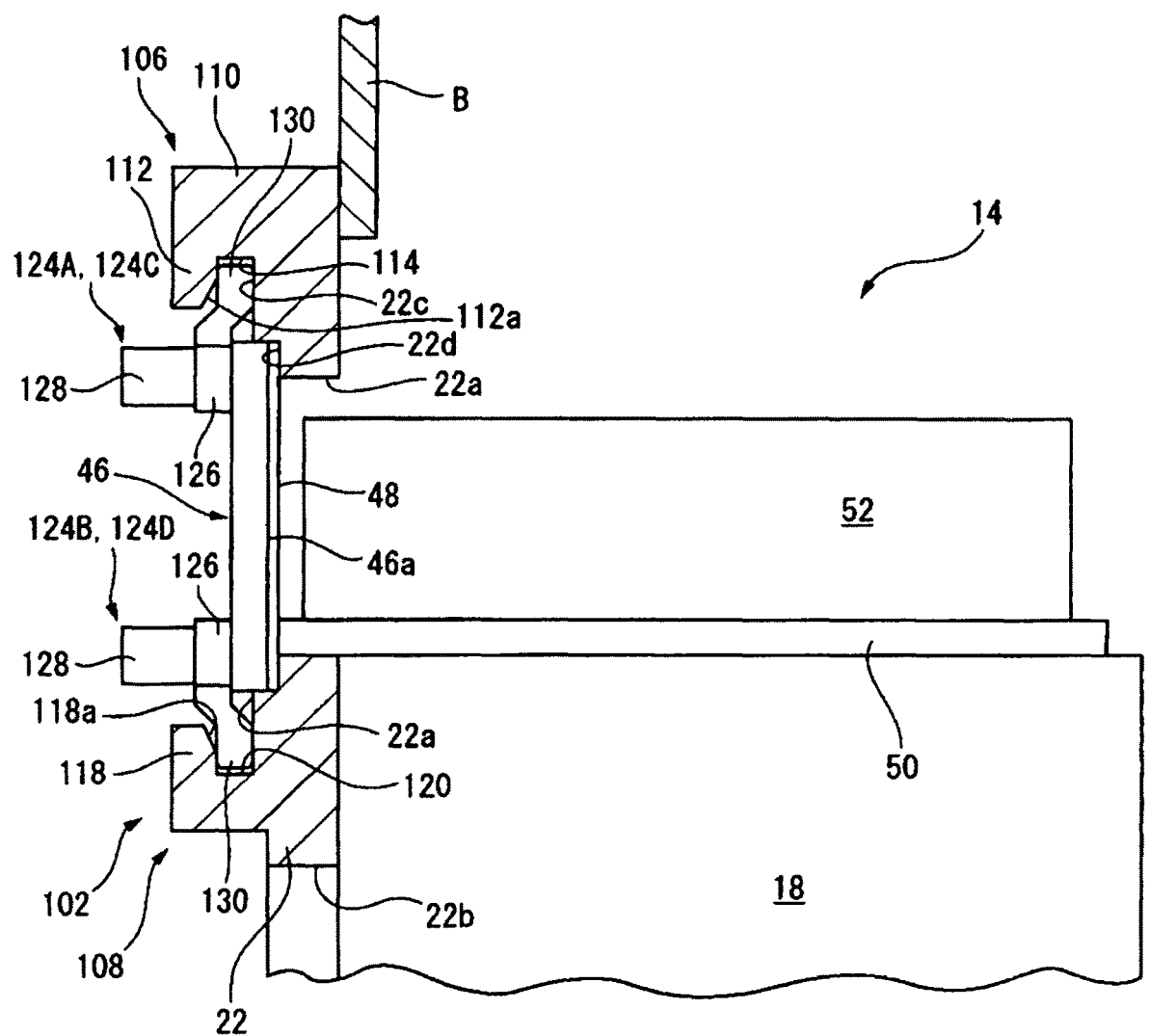
FIG. 15 is a partial cross-sectional view illustrating a state in which the restricting member illustrated in FIG. 13 is positioned in the restriction position and the fan unit is fixed to the mounting member.

By this operation, as illustrated in FIG. 15, the engaging sections 130 (specifically, the third portions 130c) of the restricting members 124A and 124C are respectively inserted into the recess 114, and contact and engage the protrusion 112 of the upper holding section 106 from the front side.

Further, the engaging sections 130 (specifically, the third portion 130c) of the restricting members 124B and 124D are respectively inserted into the recess 120, and contact and engage the protrusion 118 of the lower holding section 108 from the front side.

By the restricting members 124A to 124D thus engaging the mounting member 102, the lid 46 is restricted from moving rearward to separate away from the mounting member 102. Thus, the positions of the restricting members 124A to 124D illustrated in FIG. 15 each correspond to a restriction position.

When the operator rotates the restricting members 124A to 124D to the restriction positions, these engaging sections 130 press the protrusions 112 and 118, and as the reaction force of which, the restricting members 124A to 124D are pushed forward by the protrusions 112 and 118. As a result, the lid 46 is pressed against the mounting member 102.

In this embodiment, the inclined surfaces 112a and 118a are formed at the tip of the protrusions 112 and 118. By these inclined surfaces 112a and 118a, the restricting members 124A and 124C, and the restricting members 124B and 124D are smoothly guided into the recesses 114 and 120, respectively, when the operator rotates the restricting members 124A to 124D to the restriction positions.

In the state illustrated in FIG. 15, the lid 46 is inserted between the upper holding section 106 and the lower holding section 108, and the front surface 46a of the lid 46 comes into surface-contact with the rear surface 22c of the base plate 22. Further, the sealing member 48 contacts the second rear surface 22d of the base plate 22, and is held between the lid 46 and the second rear surface 22d and seals the gap between the lid 46 and the base plate 22. In this manner, the mounting hole 22a is air-tightly closed by the lid 46 and the sealing member 48.

In this embodiment, the sealing member 48 is configured such that the sealing member 48 is compressed between the mounting member 102 and the lid 46, and as the reaction force of which, the sealing member 48 pushes the lid 46 rearward (i.e., in a direction separating away from the mounting member 102), in the state illustrated in FIG. 15. Therefore, in this embodiment, the sealing member 48 functions as a force generating section configured to generate a force to push the lid 46 in the direction separating away from the mounting member 102.

On the other hand, when detaching the fan unit 14 from the mounting member 102, the operator rotates the restricting members 124A to 124D disposed at the restriction positions illustrated in FIG. 15 in the direction opposite to the direction when attaching the fan unit 14.

Due to this, as illustrated in FIG. 13, the engaging sections 130 of the restricting members 124A to 124D are disengaged from the protrusions 112 and 118 of the upper and lower holding sections 106 and 108, respectively. As a result, the lid 46 is allowed to move rearward (i.e., in the direction separating away from the mounting member 102). Thus, the positions of the restricting members 124A to 124D illustrated in FIG. 13 each correspond to a non-restriction position.

As described above, according to this embodiment, the restricting members 124A to 124D are attached to the lid 46 so as to be rotatable between the restriction position and the non-restriction position. According to this configuration, similarly as the above-described embodiments, the operator can easily fix or unfix the lid 46 with respect to the mounting member 102.

Further, in this embodiment, the sealing member 48 functions as a force generating section that generates a force to push the lid 46 in the direction separating away from the mounting member 102, in the state illustrated in FIG. 15.

Thus, the sealing member 48 functions as the force generating section and applies to the lid 46 a force acting in the direction orthogonal to the direction in which the restricting members 124A to 124D move from the restriction position illustrated in FIG. 15 to the non-restriction position.

Due to this force, the restricting members 124A to 124D are pressed against the protrusions 112 and 118, and the friction between the protrusion 112 and the restricting members 124A and 124C, and the friction between the protrusion 118 and the restricting members 124B and 124D are increased.

According to this configuration, since the restricting members 124A to 124D disposed at the restriction positions illustrated in FIG. 15 can be made difficult to move toward the non-restriction positions, it is possible to stably dispose the restricting members 124A to 124D at the restriction position. Therefore, if the motor drive device 70 vibrates during its operation, it is possible to prevent the restricting members 124A to 124D from disengaging from the restriction position due to the vibration.

Figure 16:
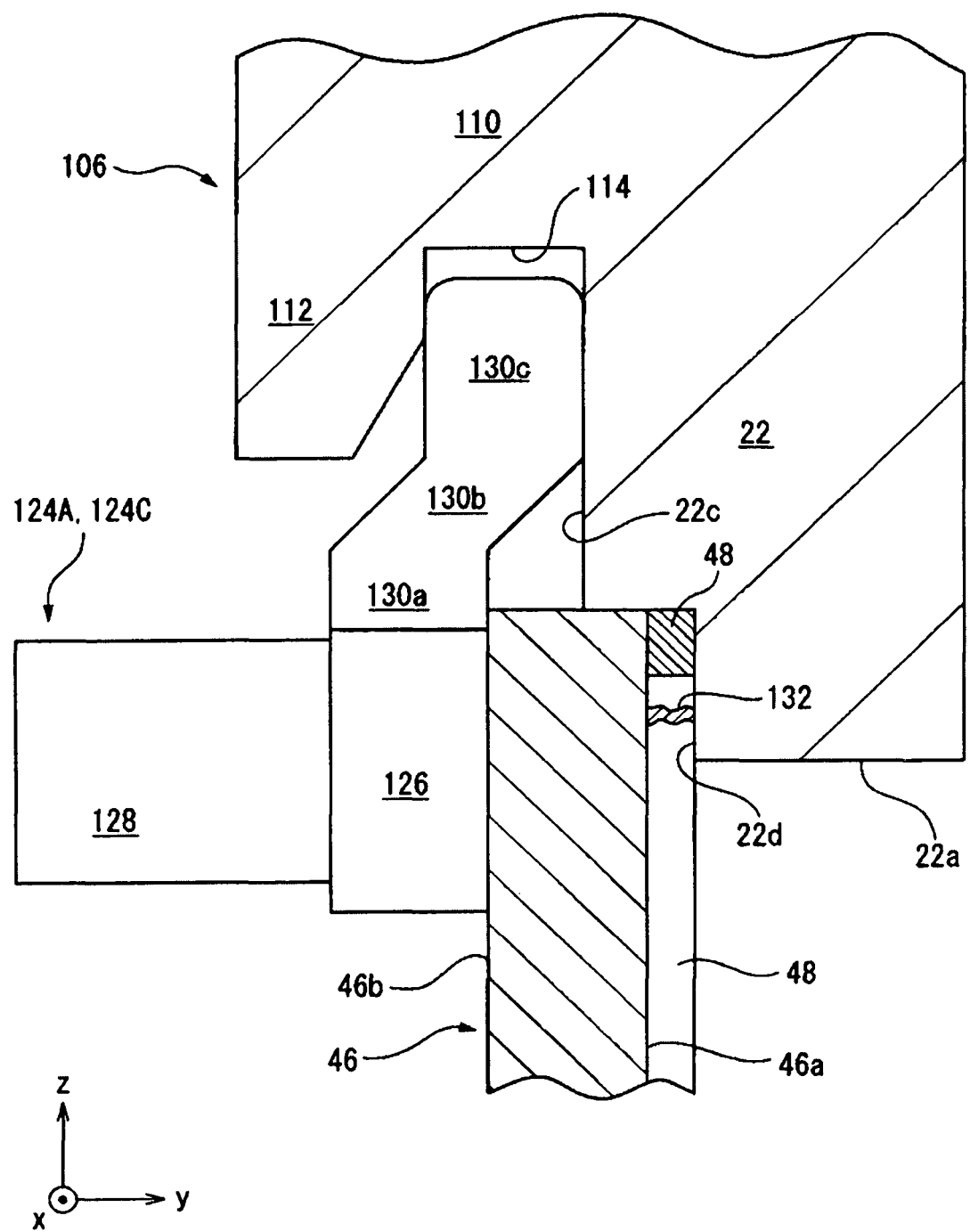
FIG. 16 is an enlarged cross-sectional view for explaining a force generating unit according to an embodiment, and corresponds to FIG. 15.

Note that, as the force generating section, an elastic member such as a spring may be applied, in place of or in addition to the sealing member 48. Such an embodiment is illustrated in FIG. 16. FIG. 16 illustrates a modification of the motor drive device 100, and is an enlarged view of the main part of FIG. 15. In this modification, in addition to the sealing member 48, an elastic member 132 is interposed between the front surface 46a of the lid 46 and the second rear surface 22d of the base plate 22.

The elastic member 132 is e.g. a spring such as a coil spring or a leaf spring, or a rubber material, and pushes the lid 46 in a direction separating away from the mounting member 102 when the restricting members 124A to 124D are disposed at the restriction positions. Thus, in this modification illustrated in FIG. 16, the sealing member 48 and the elastic member 132 constitute a force generating section.

In the above-described embodiments, the restricting members 16A to 16D and 124A to 124D are rotatably attached to the lid 46. However, the restricting member may be attached to the lid 46 so as to be linearly movable.

Such a restricting member 134 is illustrated in FIGS. 17A and 17B. The restricting member 134 is a member separate from the lid 46 and attached to the front surface 46a of the lid 46 so as to be linearly movable in the z-axis direction. The restricting member 134 can be applied to the motor drive device 10 in place of the restricting members 16A and 16C illustrated in FIG. 3, for example.

Hereinafter, the operation, in which the restricting members 134 are applied to the motor drive device 10 illustrated in FIGS. 1 to 3 in place of the restricting members 16A and 16C, will be described. When attaching the fan unit 14 to the mounting member 12, the operator first disposes the restricting member 134 at the position illustrated in FIG. 17A.

Then, the operator inserts the fan support section 50 and the fan main body 52 into the mounting hole 22a from the rear side, and pushes them forward along the axis $O_1$. Then, the operator moves the restricting members 134 from the positions as illustrated in FIG. 17A to the positions as illustrated in FIG. 17B.

As a result, the restricting members 134 contact and engage the protrusions 34 of the upper holding section 24 from the front side, whereby the lid 46 is restricted from moving rearward to separate away from the mounting member 12. Thus, the position of the restricting member 134 illustrated in FIG. 17B corresponds to a restriction position.

On the other hand, when detaching the fan unit 14 from the mounting member 12, the operator moves the restricting member 134 from the position illustrated in FIG. 17B to the position illustrated in FIG. 17A. As a result, the restricting member 134 is disengaged from the protrusion 34 of the upper holding section 24, and the lid 46 is allowed to move rearward (i.e., in a direction separating from the mounting member 12). Thus, the position of the restricting member 134 illustrated in FIG. 7A corresponds to a non-restriction position.

It should be understood that the linearly movable restricting member 134 may be applied to the motor drive device 10 in place of the restricting members 16B and 16D in FIG. 3 so as to releasably engage the protrusion 42 of the lower holding section 26.

Note that, the motor drive device 10, 70, or 100 may further include an interlocking mechanism configured to move two restricting members interlocked with each other. Such an interlocking mechanism will be described with reference to FIGS. 18 and 19.

Figure 18:
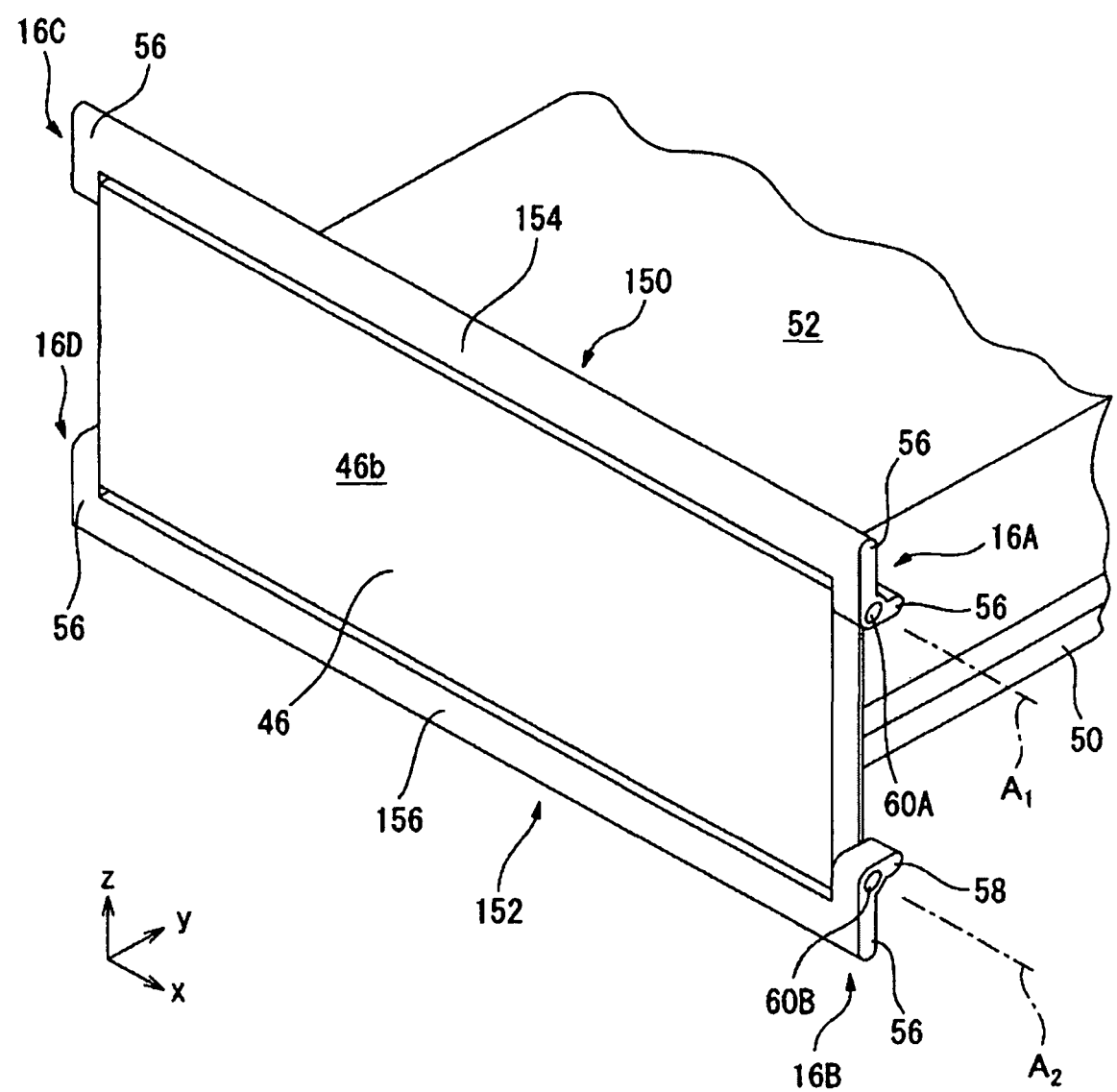
FIG. 18 is a perspective view for explaining an interlocking mechanism according to an embodiment.

FIG. 18 illustrates a case in which interlocking mechanisms 150 and 152 are applied to the motor drive device 10 illustrated in FIG. 1. In this embodiment, the motor drive device 10 includes connection sections 154 and 156.

The connection section 154 extends between the gripping section 56 of the restricting member 16A and the gripping section 56 of the restricting member 16C, and connects the restricting member 16A and the restricting member 16C with each other. In this embodiment, the connection section 154 is provided integrally with the gripping section 56 of the restricting member 16A and the gripping section 56 of the restricting member 16C.

By the connection section 154, when one of the restricting members 16A and 16C is rotated, the other of the restricting members 16A and 16C is also rotated in the same direction about the axis $A_1$ so as to interlock with the rotation of the one of the restricting members 16A and 16C. Thus, the connection section 154 constitutes the interlocking mechanism 150 that moves the restricting members 16A and 16C interlocked with each other.

On the other hand, the connection section 156 extends between the gripping section 56 of the restricting member 16B and the gripping section 56 of the restricting member 16D, and connects the restricting member 16B and the restricting member 16D with each other. In this embodiment, the connection section 156 is provided integrally with the gripping section 56 of the restricting member 16B and the gripping section 56 of the restricting member 16D.

By the connection section 156, when one of the restricting members 16B and 16D is rotated, the other of the restricting members 16B and 16D is also rotated in the same direction about the axis $A_2$ so as to interlock with the rotation of the one of the restricting members 16B and 16D. Therefore, the connection section 156 constitutes the interlocking mechanism 152 that moves the restricting members 16B and 16D interlocked with each other.

Figure 8:
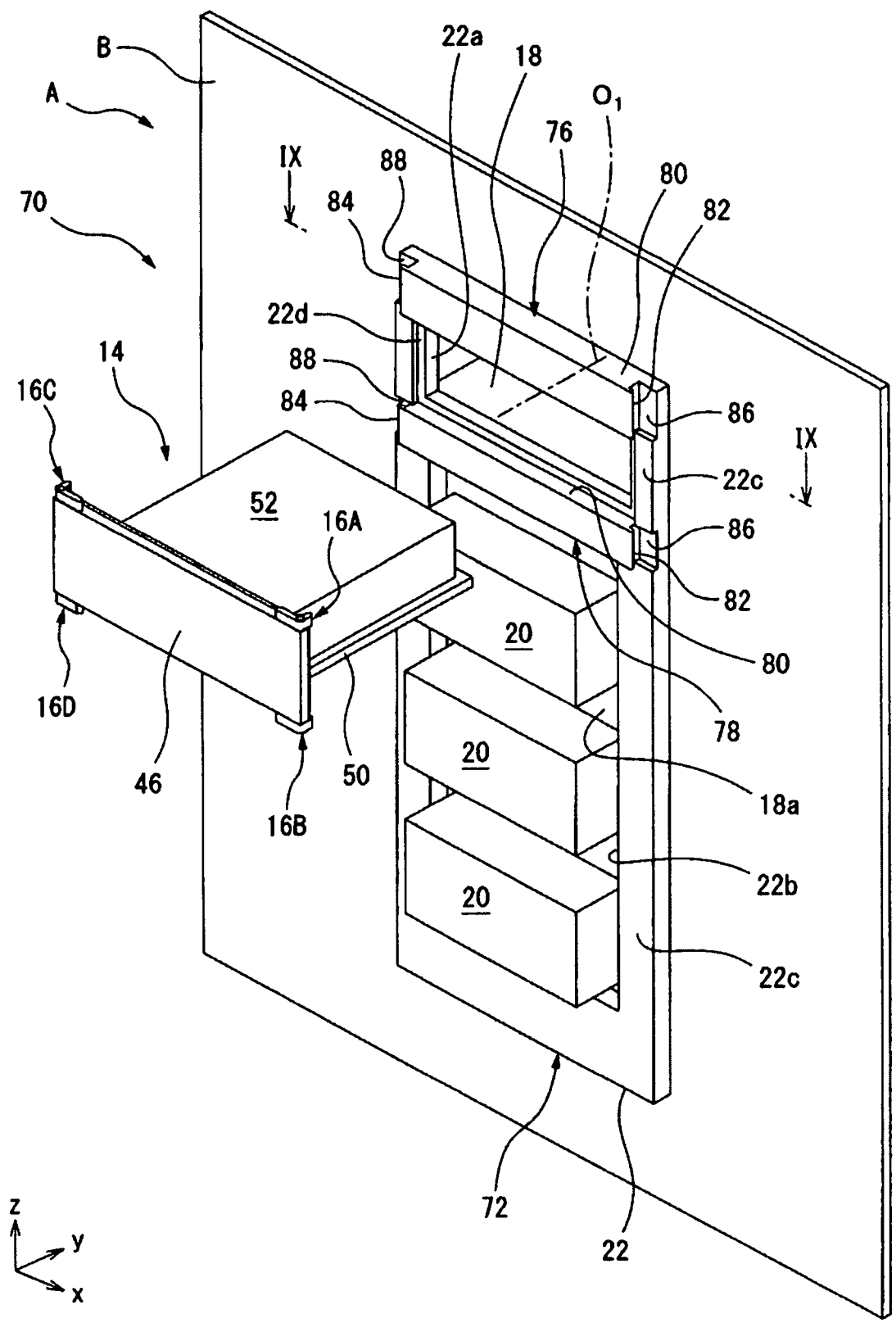
FIG. 8 is a perspective view of a motor drive device according to another embodiment.

The concept of such interlocking mechanisms 150 and 152 can be applied to the motor drive device 70 illustrated in FIG. 8. In this case, the motor drive device 70 includes a first connection section between the gripping section 56 of the restricting member 16A and the gripping section 56 of the restricting member 16B so as to connect the restricting member 16A and the restricting member 16B with each other, and a second connection section between the gripping section 56 of the restricting member 16C and the gripping section 56 of the restricting member 16D so as to connect the restricting member 16C and the restricting member 16D with each other.

FIG. 19 illustrates a case in which an interlocking mechanism 158 is applied to the motor drive device 100 illustrated in FIG. 12. In this embodiment, the motor drive device 100 includes a timing belt 160. The timing belt 160 is stretched over the outer peripheries of the cylindrical sections 126 of the restricting members 124A and 124D.

In this embodiment, a plurality of teeth (not illustrated) are formed on the inner periphery of the timing belt 160, while grooves (not illustrated) that engages the respective teeth is formed on the outer peripheries of the cylindrical sections 126 of the restricting members 124A and 124D.

For example, if the restricting member 124A is rotated about the axis $A_5$ in the clockwise direction as viewed from rearward, the rotation of the restricting member 124A is transmitted to the restricting member 124D via the timing belt 160.

As a result, the restricting member 124D is rotated about the axis $A_8$ in the clockwise direction as viewed from rearward. In this manner, the timing belt 160 constitutes the interlocking mechanism 158 that moves the restricting members 124A and 124D interlocked with each other. It should be understood that the concept of such interlocking mechanism 158 can be applied to move the restricting members 124B and 124C in conjunction with each other.

Further, the motor drive device 10, 70, or 100 may include an interlocking mechanism that interlocks two restricting members so as to move in directions opposite to each other. For example, in the embodiment illustrated in FIG. 18, a multi-stage gear mechanism is provided between the restricting member 16A and the restricting member 16B. This multi-stage gear mechanism reverses and transmits the rotation of one of the restricting members 16A and 16B to the other.

For example, if the restricting member 16A is rotated about the axis $A_1$ in the counterclockwise direction as viewed from the right side, the rotation of the restricting member 16A is reversed by the multi-stage gear mechanism and transmitted to the restricting member 16B.

As a result, the restricting member 16B is rotated about the axis $A_2$ in the clockwise direction as viewed from the right side. In this manner, the multi-stage gear mechanism constitutes an interlocking mechanism that interlocks the restricting members 16A and 16B so as to move in opposite directions. It should be understood that the concept of such interlocking mechanism can be applied to interlock the other two restricting members in opposite directions.

Note that, the motor drive device 10, 70, or 100 may further include a locking mechanism configured to releasably lock the restricting members 16A to 16D or 124A to 124D in the restriction positions. Such a locking mechanism will be described with reference to FIGS. 20 to 23.

Figure 20:
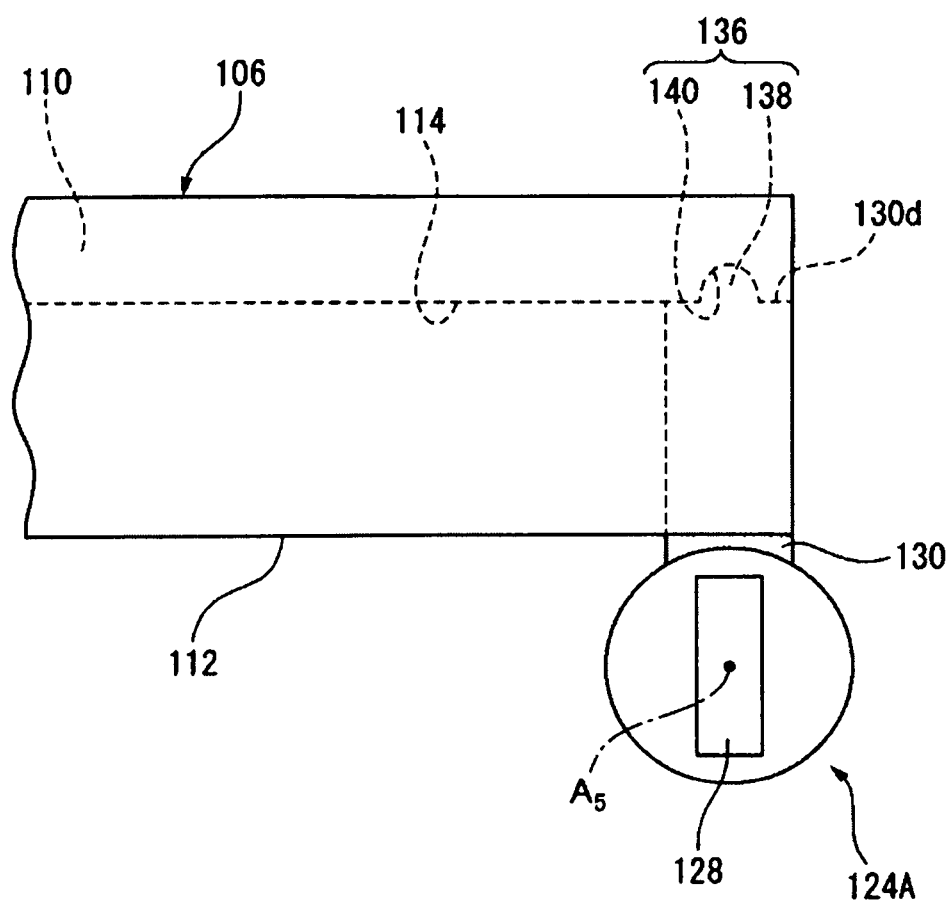
FIG. 20 is a schematic view for explaining a locking mechanism according to an embodiment.

FIG. 20 illustrates a case in which a locking mechanism 136 is applied to the motor drive device 100 illustrated in FIG. 12. Note that, FIG. 20 illustrates the state in which the restricting member 124A is disposed at the restriction position.

The locking mechanism 136 in this embodiment releasably locks the restricting member 124A in the restriction position. Specifically, the locking mechanism 136 includes a first engaging section 138 and a second engaging section 140.

The first engaging section 138 is a protrusion provided at a tip surface 130d of the engaging section 130 (specifically, the third portion 130c) of the restricting member 124A so as to protrude outward from the tip surface 130d. On the other hand, the second engaging section 140 is a recess formed to be recessed upward from the bottom surface of the base 110, which defines the recess 114 formed in the upper holding section 106.

As illustrated in FIG. 20, when the restricting member 124A is disposed at the restriction position, the first engaging section 138 and the second engaging section 140 are releasably engaged. As a result, the restricting member 124A is restricted from rotating in the clockwise direction about the axis $A_5$ as viewed from the rear side, and locked in the restriction position.

It should be understood that the concept of such a locking mechanism 136 can be applied to lock the restricting members 124B, 124C, or 124D of the motor drive device 100 in the restriction position.

Figure 21:
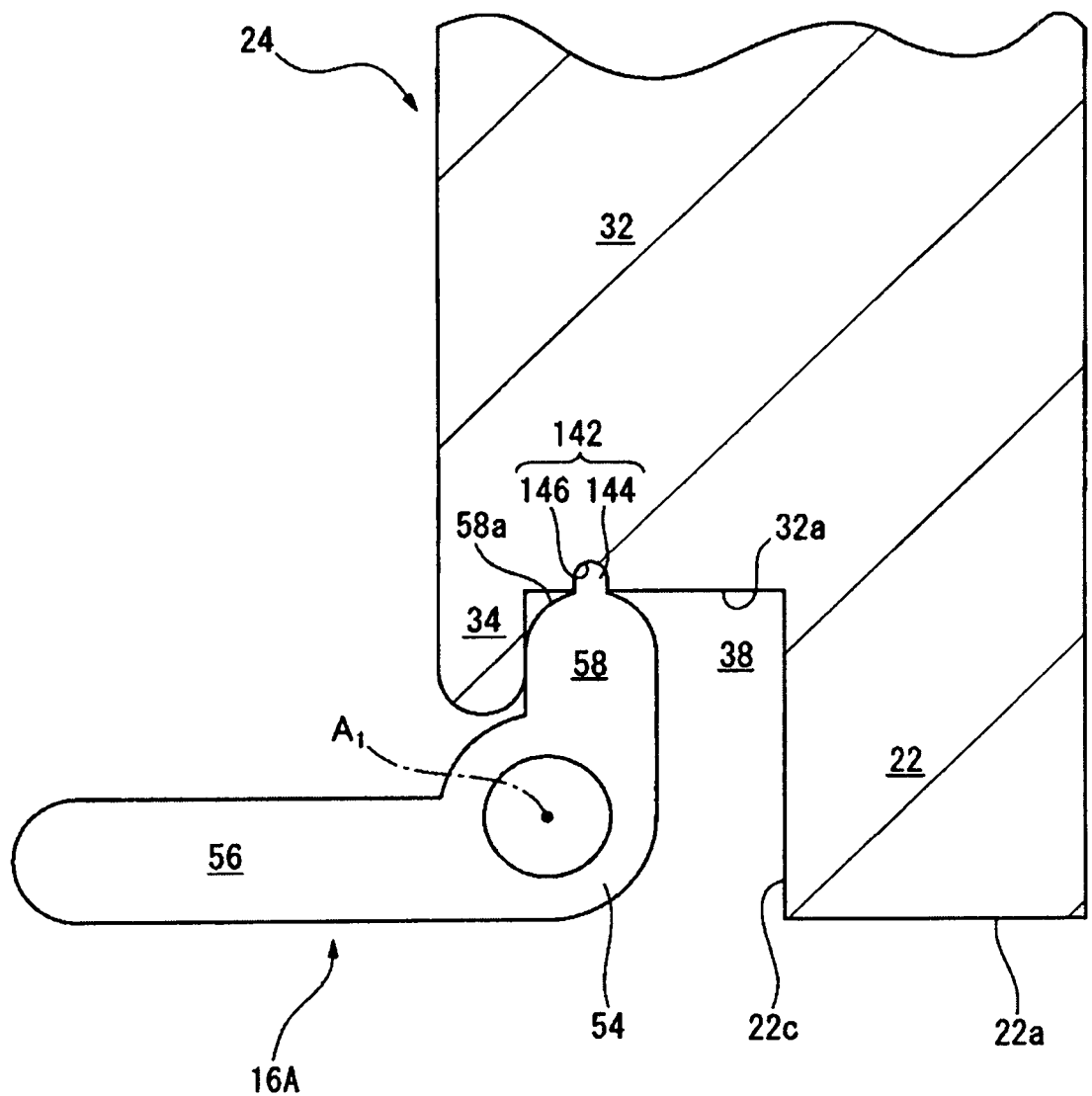
FIG. 21 is a cross-sectional view for explaining a locking mechanism according to another embodiment, and corresponds to FIG. 7.

FIG. 21 illustrates a case in which a locking mechanism 142 is applied to the motor drive device 10 illustrated in FIG. 1. Note that, FIG. 21 illustrates a state in which the restricting member 16A is disposed at the restriction position.

The locking mechanism 142 in this embodiment releasably locks the restricting member 16A in the restriction position. Specifically, the locking mechanism 142 includes a first engaging section 144 and a second engaging section 146.

The first engaging section 144 is a protrusion provided on a tip surface 58a of the engaging section 58 of the restricting member 16A so as to protrude outward from the tip surface 58a. On the other hand, the second engaging section 146 is a recess formed to be recessed upward from the bottom surface 32a of the base 32, which defines the recess 38 formed in the upper holding section 24.

As illustrated in FIG. 21, when the restricting member 16A is disposed at the restriction position, the first engaging section 144 and the second engaging section 146 are releasably engaged. As a result, the restricting member 16A is restricted from rotating in the clockwise direction about the axis $A_1$ as viewed from the right side, and locked in the restriction position.

It should be understood that the concept of such a locking mechanism 142 can be applied to lock the restricting members 16B, 16C or 16D of the motor drive device 10, or the restricting members 16A, 16B, 16C or 16D of the motor drive device 70, in the restriction positions.

Figure 22:
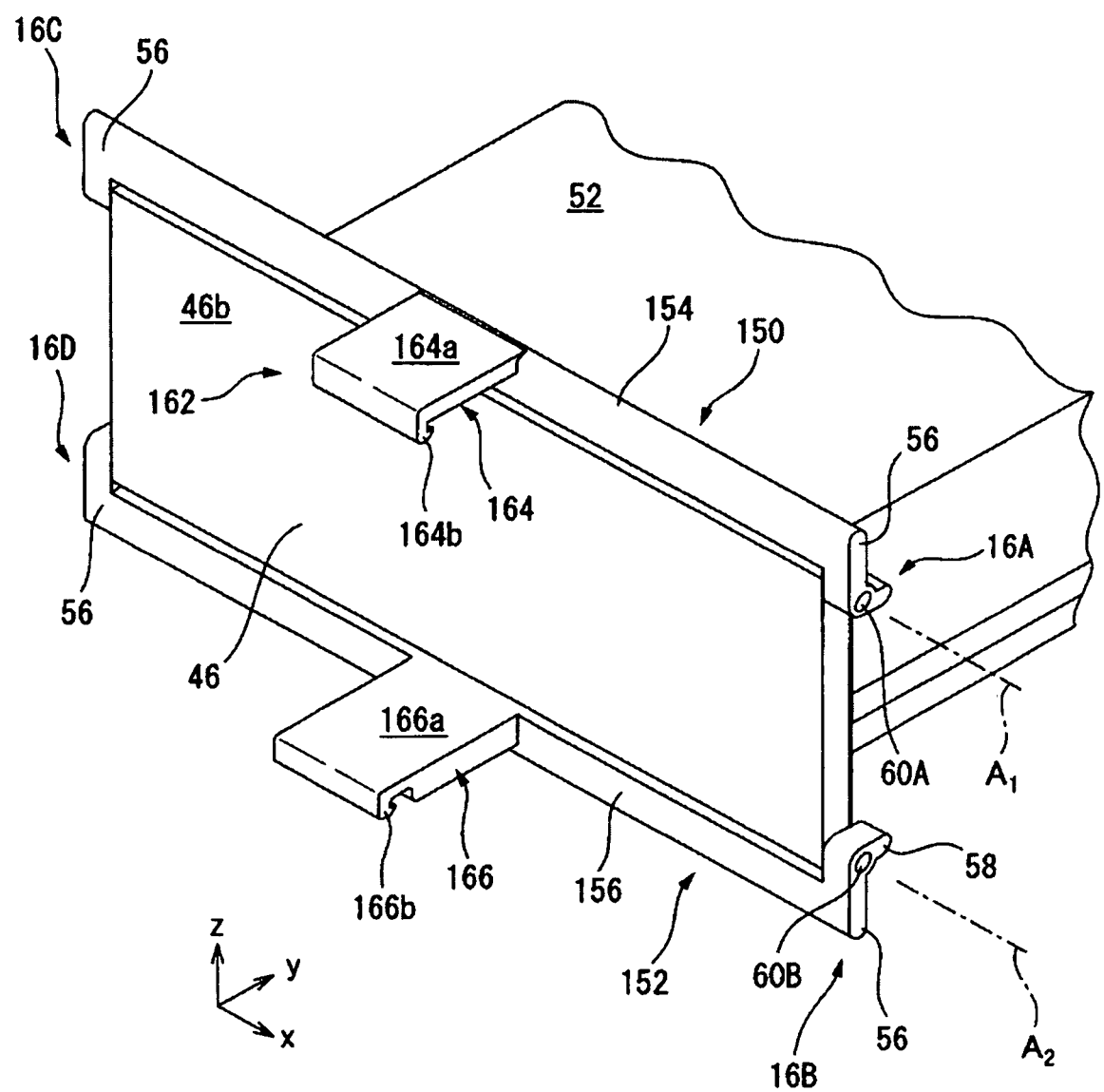
FIG. 22 is a perspective view for explaining a locking mechanism according to still another embodiment.

FIG. 22 illustrates a case in which a locking mechanism 162 is applied to the embodiment illustrated in FIG. 18. The locking mechanism 162 in this embodiment includes a first coupling member 164 and a second coupling member 166.

The first coupling member 164 is provided at the connection section 154, and includes a main body 164a and a fitting section 164b protruding from the main body 164a. On the other hand, the second coupling member 166 is provided at the connection section 156, and includes a main body 166a and a fitting section 166b protruding from the main body 166a.

Note that, the first coupling member 164 may be provided at the connection section 154 so as to be rotatable about an axis parallel to the x-axis. Also, the second coupling member 166 may be provided at the connection section 156 so as to be rotatable about an axis parallel to the x-axis.

Figure 23:
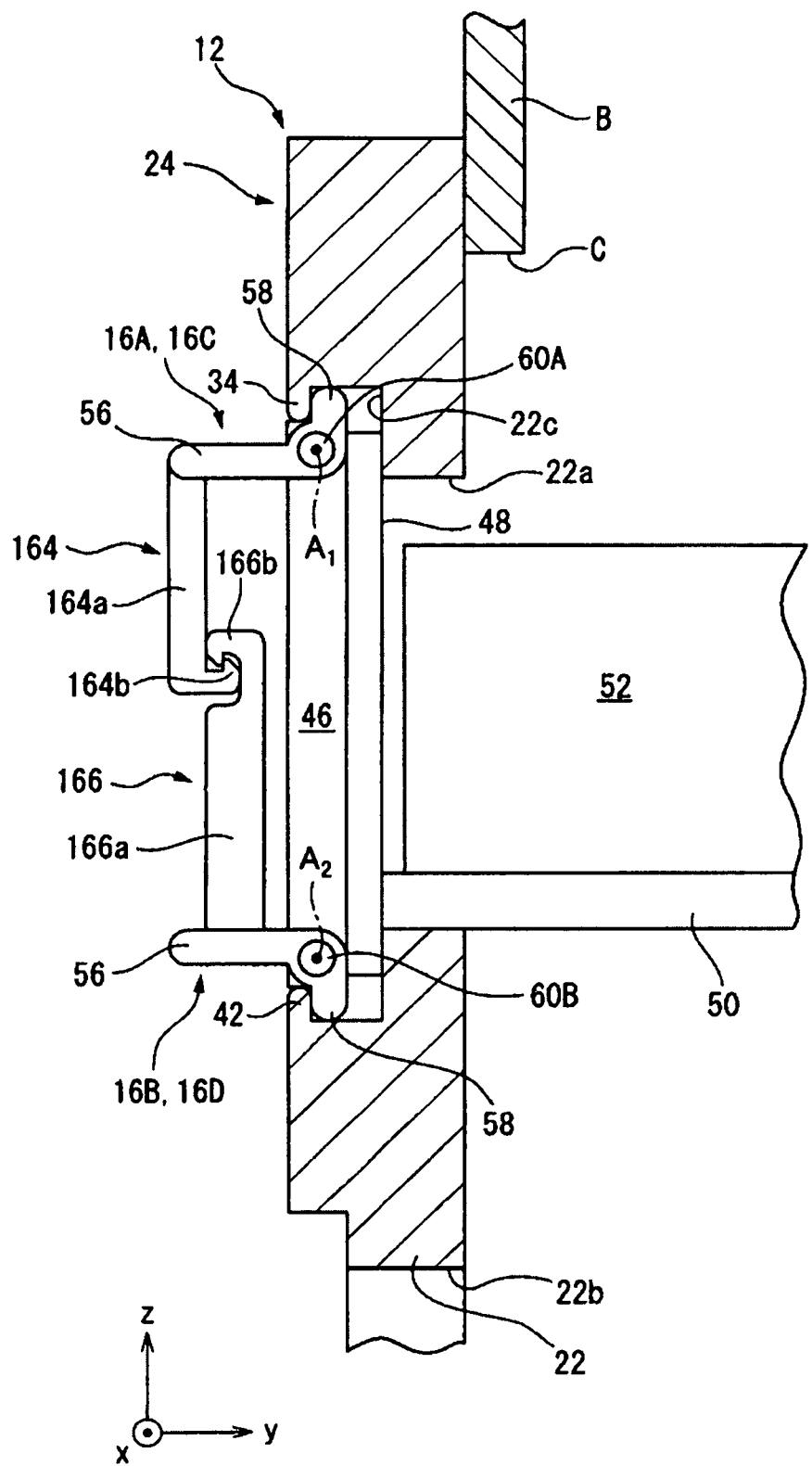
FIG. 23 is a partial cross-sectional view illustrating a state in which the restricting member is locked by the locking mechanism illustrated in FIG. 22.

As illustrated in FIG. 23, when the restricting members 16A to 16D are disposed at the restriction positions, the fitting section 164b of the first coupling member 164 and the fitting section 166b of the second coupling member 166 are fitted to each other.

By this fitting, the restricting members 16A and 16C are restricted from rotating about the axis $A_1$ in the clockwise direction as viewed from the right side, and also, the restricting members 16B and 16D are restricted from rotating about the axis $A_2$ in the counterclockwise direction.

In this manner, the first coupling member 164 and the second coupling member 166 constitute a coupling mechanism configured to releasably couple the restricting members 16A and 16C with the restricting members 16B and 16D, so as to restrict the movement toward the non-restriction positions when the restricting members 16A to 16D are disposed at the restriction positions.

It should be understood that the concept of such a locking mechanism 162 can also be applied to the motor drive device 70 illustrated in FIG. 8. In this case, the locking mechanism 162 can be applied to the motor drive device 70 illustrated in FIG. 8, along with applying the connection sections 154 and 156 thereto.

The locking mechanism may be configured to increase the friction between the restricting member and the mounting member as the restricting member moves to the restriction position. Such a locking mechanism will be described with reference to FIG. 24.

Figure 24:
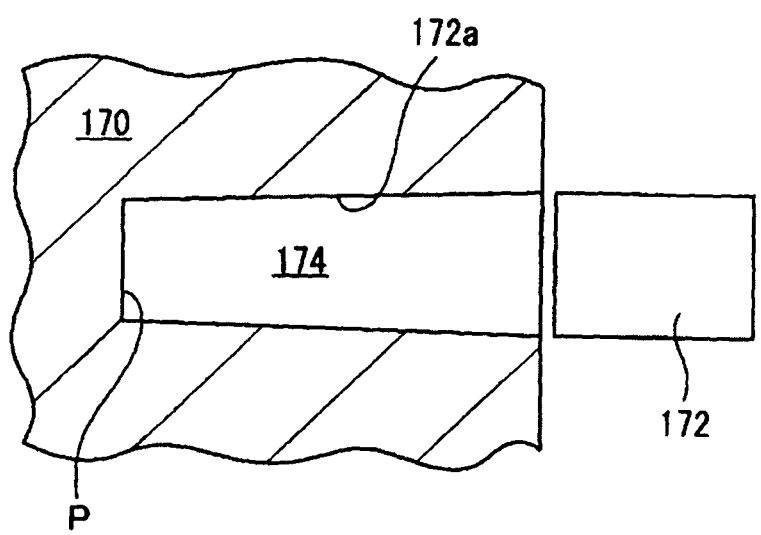
FIG. 24 is a conceptual diagram of a locking mechanism according to still another embodiment.

In the embodiment illustrated in FIG. 24, a restricting member 172 is movably attached to the lid 46 (not illustrated), wherein the restricting member 172 is moved from a non-restriction position so as to be inserted into a recess 174 formed in a mounting member 170. When the restricting member 172 is moved to a restriction position P, the lid 46 is restricted from moving in a direction separating from the restricting member 172.

A wall surface 172a that defines the recess 174 is formed such that the restricting member 172 is pressed against the wall surface 172a stronger as the restricting member 172 approaches the restriction position P, whereby increasing the friction between the restricting member 172 and the wall surface 172a. For example, the wall surface 172a is an inclined surface inclined with respect to the movement direction of the restricting member 172.

By the thus-formed wall surface 172a, the friction between the restricting member 172 and the wall surface 172a when the restricting member 172 is disposed at the restriction position P is greater than that when the restricting member 172 is displaced from the restriction position P toward the non-restriction position.

Due to this friction, since the restricting member 172 disposed at the restriction position P is restricted from moving toward the non-restriction position, it is possible to lock the restricting member 172 in the restriction position P.

Thus, in this embodiment, the wall surface 172a constitutes a locking mechanism. It should be understood that the concept of such a locking mechanism can be applied to the motor drive device 10, 70, or 100. Note that, in the above-described embodiments, the lid 46 may be configured so as to cover a part of the mounting hole 22a.

While the present disclosure has been described through specific embodiments, the above-described embodiments do not limit the invention as defined by the appended claims.

The invention claimed is:

1. A motor drive device comprising:
   a mounting member formed with a mounting hole;
   a fan unit fixed to the mounting member, the fan unit including:
      a lid disposed to face the mounting member so as to cover at least a part of the mounting hole; and
      a sealing member provided on a surface of the lid that faces the mounting member; and
   at least one restricting member attached to the lid so as to be movable with respect to the lid, the restricting member being movable between a restriction position, in which the restricting member engages the mounting member and restricts the lid from moving in a separating direction away from the mounting member, and a non-restriction position, in which the restricting member disengages from the mounting member and allows the lid to move in the separating direction,
   wherein the mounting member includes:
      a first surface facing the separating direction and extending around the mounting hole; and
      a second surface facing the separating direction and disposed separate away from the first surface in the separating direction,
   wherein, when the at least one restricting member is disposed at the restriction position, the surface of the lid contacts the second surface, and the sealing member is held between the surface of the lid and the first surface so as to seal a gap between the surface of the lid and the first surface.

2. The motor drive device of claim 1, wherein the restricting member is attached to the lid so as to be rotatable between the restriction position and the non-restriction position.

3. The motor drive device of claim 2, wherein the restricting member is rotatable about an axis parallel to the separating direction, or an axis intersecting with the separating direction.

4. The motor drive device of claim 1, wherein the restricting member is attached to the lid so as to be linearly movable between the restriction position and the non-restriction position.

5. The motor drive device of claim 1, further comprising an interlocking mechanism configured to move a first restricting member and a second restricting member so as to be interlocked with each other.

6. The motor drive device of claim 5, wherein the interlocking mechanism includes a connection section extending between the first restricting member and the second restricting member so as to connect the first restricting member and the second restricting member with each other.

7. The motor drive device of claim 1, further comprising a force generating section interposed between the mounting member and the lid, and configured to generate a force to push the lid in the separating direction when the restricting member is disposed at the restriction position.

8. The motor drive device of claim 7, wherein the sealing member is elastic and functions as the force generating section to push the lid in the separating direction when the sealing member is held between the surface of the lid and the first surface.

9. The motor drive device of claim 1, further comprising a locking mechanism configured to releasably lock the restricting member in the restriction position.

10. The motor drive device of claim 9, wherein the locking mechanism includes:
   a first engaging section provided at one of the restricting member and the mounting member; and
   a second engaging section provided at the other of the restricting member and the mounting member, and releasably engages the first engaging section when the restricting member is disposed at the restriction position.

11. The motor drive device of claim 9, wherein the locking mechanism includes a coupling mechanism configured to releasably couple a first restricting member with a second restricting member so as to restrict movement of the first and second restricting members from the restriction positions toward the non-restriction positions when the first and second restricting members are respectively disposed at the restriction positions.

* * * * *